(12) United States Patent
Morii et al.

(10) Patent No.: US 11,183,639 B2
(45) Date of Patent: Nov. 23, 2021

(54) ORGANIC ELECTROLUMINESCENT ELEMENT

(71) Applicants: NIPPON SHOKUBAI CO., LTD., Osaka (JP); NIPPON HOSO KYOKAI, Tokyo (JP)

(72) Inventors: Katsuyuki Morii, Osaka (JP); Kaho Maeda, Osaka (JP); Akiko Kuriyama, Osaka (JP); Hirohiko Fukagawa, Tokyo (JP); Takahisa Shimizu, Tokyo (JP)

(73) Assignees: Nippon Shokubai Co., Ltd., Osaka (JP); Nippon Hoso Kyokai, Tokyo (JP)

( * ) Notice: Subject to any disclaimer, the term of this patent is extended or adjusted under 35 U.S.C. 154(b) by 0 days.

(21) Appl. No.: 16/647,717

(22) PCT Filed: Sep. 18, 2018

(86) PCT No.: PCT/JP2018/034468
§ 371 (c)(1),
(2) Date: Mar. 16, 2020

(87) PCT Pub. No.: WO2019/059178
PCT Pub. Date: Mar. 28, 2019

(65) Prior Publication Data
US 2020/0220080 A1    Jul. 9, 2020

(30) Foreign Application Priority Data
Sep. 19, 2017 (JP) .............................. JP2017-178914

(51) Int. Cl.
*H01L 51/00*  (2006.01)
*H01L 51/50*  (2006.01)

(52) U.S. Cl.
CPC .......... *H01L 51/004* (2013.01); *H01L 51/005* (2013.01); *H01L 51/5056* (2013.01);
(Continued)

(58) Field of Classification Search
CPC ..... H01L 51/50; H01L 51/004; H01L 51/005; H01L 2251/558; H01L 51/5072; H01L 51/5056; H01L 51/5092
See application file for complete search history.

(56) References Cited

U.S. PATENT DOCUMENTS

| | | | |
|---|---|---|---|
| 2009/0174315 A1* | 7/2009 | Furukawa | H01L 51/5278 313/504 |
| 2012/0211782 A1* | 8/2012 | Matsuda | H05B 33/26 257/89 |

(Continued)

FOREIGN PATENT DOCUMENTS

| | | |
|---|---|---|
| JP | 2009-070954 | 4/2009 |
| JP | 2014-168014 | 9/2014 |

(Continued)

OTHER PUBLICATIONS

Machine translated document (JP 2014-168014) (Year: 2014).*

(Continued)

*Primary Examiner* — Ahmed N Sefer
(74) *Attorney, Agent, or Firm* — Hamre, Schumann, Mueller & Larson, P.C.

(57) ABSTRACT

The present invention provides an organic electroluminescence device having excellent luminous efficiency and excellent luminance. The present invention relates to an organic electroluminescence device including a structure in which a plurality of layers is laminated between an anode and a cathode formed on a substrate; wherein the organic electroluminescence device includes a metal oxide layer between the anode and the cathode; and a nitrogen-containing film layer having an average thickness of not less than 0.1 nm but less than 3 nm adjacent to the metal oxide layer and disposed on an anode side.

5 Claims, 11 Drawing Sheets

(52) U.S. Cl.
CPC ...... *H01L 51/5072* (2013.01); *H01L 51/5092* (2013.01); *H01L 2251/558* (2013.01)

(56) References Cited

U.S. PATENT DOCUMENTS

| | | | |
|---|---|---|---|
| 2015/0024532 A1* | 1/2015 | Kim | H01L 51/5206 438/46 |
| 2016/0035979 A1 | 2/2016 | Lee et al. | |
| 2016/0204367 A1* | 7/2016 | Forrest | H01L 51/4273 257/40 |
| 2017/0125488 A1* | 5/2017 | Kawato | H01L 51/424 |
| 2017/0144337 A1* | 5/2017 | Matsen | B29C 43/52 |
| 2017/0288156 A1* | 10/2017 | Son | H01L 51/0047 |

FOREIGN PATENT DOCUMENTS

| | | |
|---|---|---|
| TW | 201402585 | 1/2014 |
| WO | 2015/166562 | 11/2015 |

OTHER PUBLICATIONS

Kim, et al., Polyethylene Imine as an Ideal Interlayer for Highly Efficient Inverted Polymer Light-emitting Diodes", Advanced Functional Materials", Mar. 10, 2014, vol. 24, pp. 3808-3814.

Takada, et al., "Electron injection in inverted organic light-emitting diodes with poly(ethyleneimine) electron injection layers", Organic Electronics, Aug. 3, 2017, vol. 50, pp. 290-298.

Zhou, et al., "A Universal Method to Produce Low-Work Function Electrodes for Organic Electronics", Science, Apr. 20, 2012, vol. 336, pp. 327-332.

Xiong, et al., "A soluble nonionic surfactant as electron injection material for high-efficiency inverted bottom-emission organic light emitting diodes" Applied Physics Letters, Jul. 1, 2008, vol. 93, pp. 123310-123310-3.

Chen, et al., "Solution-processable small molecules as efficient universal bipolar hose for blue, green and red phosphorescent inverted OLEDs", Journal of Materials Chemistry, 2012, vol. 22, pp. 5164-5170.

\* cited by examiner (a)

(b)

(a)

(b)

(a)

(b)

(a)

(b)

(a)

(b)

※ Number of devices subjected to measurement
Annealing under $N_2$ ⋯3
No annealing ⋯3

※ Number of devices subjected to measurement
Annealing in air   10 minutes ··· 2
Annealing in air   2 hours ··· 3
Annealing under $N_2$  10 minutes ··· 4
Annealing under $N_2$  2 hours ··· 4

ORGANIC ELECTROLUMINESCENT ELEMENT

TECHNICAL FIELD

The present invention relates to organic electroluminescence devices. More specifically, the present invention relates to an organic electroluminescence device that can be used for a display device such as a display unit of an electronic device, a lighting system, and the like.

BACKGROUND ART

An organic electroluminescence device (organic EL device) is promising as a novel luminescence device applicable to display devices and lightings.

The organic EL device has a structure in which one or more kinds of layers including an emitting layer containing a light-emitting organic compound are disposed between an anode and a cathode. The organic electroluminescence device excites the light-emitting organic compound with energy generated upon recombination of holes injected from the anode with electrons injected from the cathode to achieve emission. The organic EL device is a current-driven device. For more efficient use of a flowing current, various improvements have been made in device structures and various studies have been made on materials of the layers constituting the device.

In the organic electroluminescence device that excites the light-emitting organic compound with energy generated upon recombination of holes injected from the anode with electrons injected from the cathode to achieve emission, smooth hole injection from the anode and smooth electron injection from the cathode are important. For more smooth hole injection and more smooth electron injection, various materials for the hole injection layer and the electron injection layer have been studied. Recently, a conventional organic electroluminescence device using polyethylenimine or a compound modified with polyethylenimine as a material that can provide an electron injection layer by coating has been reported (Non-Patent Literatures 1 to 3).

An organic electroluminescence device in which the layers between the cathode and the anode are all formed from organic compounds is prone to degradation due to oxygen and water. Such a device has to be strictly sealed to prevent entry of oxygen and water. This complicates the production of the organic electroluminescence device. In response to this issue, an organic-inorganic hybrid light-emitting diode device (HOILED device) in which part of the layers between the cathode and the anode is formed from an inorganic oxide has been proposed (Patent Literature 1). In the device, use of a hole transport layer and an electron transport layer formed from inorganic oxides enables use of a conductive oxide electrode such as FTO or ITO as a cathode and use of gold as an anode. This means that larger variety of electrodes can be used for driving the device. As a result, use of metal having a low work function, such as an alkali metal or an alkali metal compound, is no longer required and emission without strict sealing can be achieved. Further, a standard HOILED device includes a cathode directly on the substrate, and this device is of an inverted type including an anode as the upper electrode. With the development of oxide TFTs, use of these TFTs in large organic EL displays have been examined. In particular, inverted organic EL devices are attracting interest owing to the features of n-type oxide TFTs. This HOILED device has been expected to develop to be an inverted organic EL device. In addition, a HOILED device including a nitrogen-containing film layer such as a polyethylenimine layer having an average thickness of 3 to 150 nm has been proposed (Patent Literature 2, Non-Patent Literature 4).

CITATION LIST

Patent Literature

Patent Literature 1: JP 2009-70954 A
Patent Literature 2: JP 2014-168014 A

Non-Patent Literature

Non-Patent Literature 1: Tao Xiong and three others, "Applied Physics Letters", vol. 93, 2008, pp. 123310-1
Non-Patent Literature 2: Yinhua Zhou and twenty-one others, "Science", vol. 336, 2012, pp. 327
Non-Patent Literature 3: Jianshan Chen and six others, "Journal of Materials Chemistry", 2012, vol. 22, pp. 5164
Non-Patent Literature 4: Young-Hoon Kim and five others, "Advanced Functional Materials", vol. 24, 2014, pp. 3808

SUMMARY OF INVENTION

Technical Problem

Although various studies have been made on structures and materials of the organic electroluminescence device as described above, an organic electroluminescence device having more improved luminous efficiency and luminance has been required so as to be used for display devices and lightings, and an organic electroluminescence device much better in these properties has been required to be developed.

The present invention has been made in view of such a current state of the art and aims to provide an organic electroluminescence device having excellent luminous efficiency and excellent luminance.

Solution to Problem

The present inventors have conducted various studies on an organic electroluminescence device having excellent luminous efficiency and excellent luminance and found that an organic electroluminescence device including a thin nitrogen-containing film layer having an average thickness of not less than 0.1 nm but less than 3 nm adjacent to a metal oxide layer between an anode and cathode and disposed on an anode side has enhanced luminous efficiency and enhanced luminance. Thereby, the present inventors reached the present invention.

The present invention relates to an organic electroluminescence device including a structure in which a plurality of layers is laminated between an anode and a cathode formed on a substrate;
  wherein the organic electroluminescence device includes
    a metal oxide layer between the anode and the cathode; and
  a nitrogen-containing film layer having an average thickness of not less than 0.1 nm but less than 3 nm adjacent to the metal oxide layer and disposed on an anode side.

Advantageous Effects of Invention

The organic electroluminescence device of the present invention is an inverted organic-inorganic hybrid type organic electroluminescence device that does not need strict sealing, and has excellent luminous efficiency and excellent luminance. Thus, the organic electroluminescence device of the present invention can be suitably used as a material of a display device or a lighting system.

DESCRIPTION OF EMBODIMENTS

Figure 1:
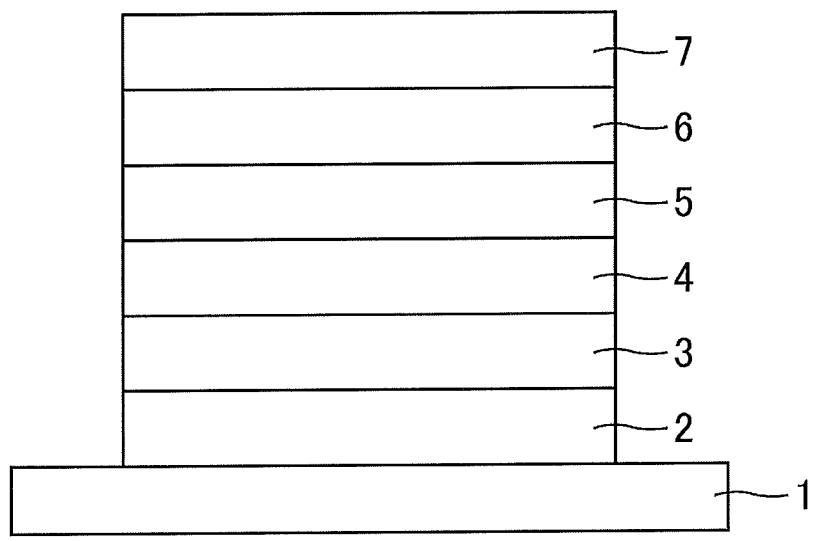
FIG. 1 is a schematic view of an exemplary laminated structure of an organic electroluminescence device of the present invention.

The present invention is described in detail below.

A combination of two or more of individual preferred embodiments of the present invention described below is also a preferred embodiment of the present invention.

The organic electroluminescence device of the present invention is a so-called inverted organic-inorganic hybrid electroluminescence device (HOILED device) including a cathode on a substrate and a metal oxide layer between an anode and the cathode, and it further includes a nitrogen-containing film layer having an average thickness of not less than 0.1 nm but less than 3 nm adjacent to the metal oxide layer and disposed on an anode side. A point of the organic electroluminescence device of the present invention is that dipoles between the metal of the metal oxide and the nitrogen in the nitrogen-containing film and dipoles in the nitrogen-containing film reduce an electron injection barrier, and the metal oxide and the nitrogen-containing film material are disposed (e.g., laminated) in a desired direction (in the order of the metal oxide and the nitrogen-containing film material in the direction of electron injection). The thin nitrogen-containing film layer having an average thickness of not less than 0.1 nm but less than 3 nm in the present invention is suitable concerning latter dipoles. The reason is as follows. With a very thin nitrogen-containing film, the orientation of the molecules at the interface is adopted for most of the molecules in the nitrogen-containing film. On the other hand, with a very thick nitrogen-containing film, dipoles may have different directions due to the three-dimensional structures of the molecules in the film, which may result in offset of the orientations of the dipoles. Owing to this principle, the structure (configuration) of the device can be freely selected.

As long as the organic electroluminescence device of the present invention has the above-described features, it may include any number of other layers, and the other layers may be formed from any material and may be laminated in any order. Preferably, the metal oxide layer and a nitrogen-containing compound layer are disposed between the cathode and an emitting layer. Since the nitrogen-containing compound has excellent electron injection properties, the organic electroluminescence device having such a layer structure has high electron injection properties and excellent luminous efficiency.

There are four types of nitrogen-containing films usable in the organic electroluminescence device of the present invention: (1) a nitrogen-containing film formed from a nitrogen-containing compound on a metal oxide layer; (2) a high nitrogen-containing film formed from a nitrogen-containing compound on a metal oxide layer, (3) a nitrogen-containing film formed by decomposition of a nitrogen-containing compound on a metal oxide layer; and (4) a high nitrogen-containing film formed by decomposition of a nitrogen-containing compound on a metal oxide layer.

The reasons why the organic electroluminescence device including such a film has improved properties are presumed as follows.

Nitrogen atoms, if present, tend to form bonds with metal atoms in a base material through lone pairs of electrons of the nitrogen atoms. The polarization of the metal-nitrogen bonds leads to high electron injection properties. The nitrogen-containing films (1) to (4) all satisfy this feature. The nitrogen-containing film (2) is more suitable which has a high proportion of nitrogen atoms having lone pairs of electrons.

The nitrogen-containing films (3) and (4) are expected to be films having a high density of nitrogen atoms on a base material owing to the phenomenon of decomposition involved in film formation, and as a result, formation of a variety of metal-nitrogen bonds is expected. These metal-nitrogen bonds are considered to include a bond in which metal and nitrogen are more firmly bonded to each other than those of a conventional bond. Further, unnecessary carbon or other components may disappear depending on the state of decomposition, so that the percentage of nitrogen atoms relatively increases. As a result, a more favorable environment may be achieved (4). Since many of nitrogen atoms in these nitrogen-containing films have metal-nitrogen bonds, the nitrogen atoms are expected to be more highly densely integrated than molecules integrated by usual physical adsorption. Owing to these factors, the organic electroluminescence device including such a nitrogen-containing film seems to have excellent luminous efficiency, excellent driving stability, and excellent lifetime. In fact, the phenomenon resulting from the decomposition of the nitrogen-containing compound can be verified by X-ray photoelectron spectroscopy, which is one of surface analysis techniques. The specific results will be described in the Examples. By decomposing a compound containing nitrogen and carbon as constituents as a nitrogen-containing compound, a high nitrogen proportion in which the carbon: nitrogen ratio (C/N ratio) is 2:1 to 1:1 is confirmed. At the same time, the half-value width of the nitrogen spectrum is increased by the above decomposition, which indicates the spread of the chemical environment and suggests the presence of a more firm metal-nitrogen bond.

Accordingly, use of a film containing a metal element as a base of the nitrogen-containing film layer is considered to greatly contribute to achievement of the effects of the organic electroluminescence device of the present invention described above.

The nitrogen-containing films (1) and (2) are each formed from a nitrogen-containing compound and disposed adjacent to the metal oxide layer. In other words, they are formed without decomposing the nitrogen-containing compound. The nitrogen-containing film (2) is formed from a nitrogen-containing compound having a high proportion of the number of nitrogen atoms to the total number of atoms constituting the nitrogen-containing compound.

The nitrogen-containing films (1) and (2) may be formed by any method. They are suitably formed by applying a solution of the nitrogen-containing compound to the metal oxide layer so that the compound is adjacent to the metal oxide layer, and volatilizing the solvent.

The nitrogen-containing films (3) and (4) are each formed by decomposition of a nitrogen-containing compound on the metal oxide layer. The nitrogen-containing compound may not be completely decomposed. Preferably, the nitrogen-containing compound is completely decomposed.

The nitrogen-containing films (3) and (4) may be formed by any method. They are suitably formed by applying a solution of the nitrogen-containing compound to the metal oxide layer, and decomposing the nitrogen-containing compound.

A distinct feature of the organic electroluminescence device of the present invention is that the nitrogen-containing film layer has an average thickness of not less than 0.1 nm but less than 3 nm.

Non-Patent Literature 4 discloses that use of polyethylenimine as a material of the electron injection layer in an inverted HOILED device can decrease the work function, leading to a low electron injection barrier. Non-Patent Literature 4 suggests that although the change in work function owing to polyethyleneimine increases as the thickness of the polyethyleneimine layer decreases, the effect of this does not differ between when the thickness of the polyethyleneimine layer is 8 nm and when it is 4 nm; and even if the thickness of the layer is reduced to smaller than about 8 nm, no further improvement in the effect can be expected. On the other hand, the present invention can lead to an inverted HOILED device having excellent luminous efficiency and excellent luminance as a result of including a nitrogen-containing film adjacent to the metal oxide layer and having an average thickness of not less than 0.1 nm but less than 3 nm, which is smaller than the thickness of the layer disclosed in Non-Patent Literature 4. Thereby, an effect that cannot be expected from the conventional art can be obtained.

The average thickness of the nitrogen-containing film layer is not less than 0.1 nm but less than 3 nm, preferably not less than 0.5 nm and 2.9 nm or less, more preferably not less than 1.0 nm and 2.7 nm or less, still more preferably not less than 1.5 nm and 2.5 nm or less.

The average thickness of the nitrogen-containing film layer can be measured by the method described in the Examples.

The nitrogen-containing film contains a nitrogen element and a carbon element as elements constituting the film. The proportions of the nitrogen atoms and the carbon atoms present in the film preferably satisfy the following relationship:

Number of nitrogen atoms/(number of nitrogen atoms+number of carbon atoms)>$1/8$.

Such a high proportion of the number of nitrogen atoms in the nitrogen-containing film increases the total number of the metal-nitrogen bonds to give stronger polarization, leading to higher electron injection properties. The nitrogen-containing film more preferably satisfies the relationship:

Number of nitrogen atoms/(number of nitrogen atoms+number of carbon atoms)>$1/5$.

The proportions of the nitrogen element and the carbon element present in the nitrogen-containing film can be measured by photoelectron spectroscopy (XPS).

Examples of the nitrogen-containing compound include a compound containing a nitrogen-containing heterocycle, such as pyrrolidones (e.g., polyvinylpyrrolidone), pyrroles (e.g., polypyrrole), anilines (e.g., polyaniline), pyridines (e.g., polyvinylpyridine), pyrrolidines, imidazoles, piperidines, pyrimidines, and triazines; and amine compounds. Preferred among these is a nitrogen-containing compound having a primary amine structure. In other words, in a preferred embodiment of the present invention, the nitrogen-containing film is a film derived from a nitrogen-containing compound having a primary amine structure.

The nitrogen-containing compound is preferably a high nitrogen content compound such as a polyamine. A polyamine, which has a high proportion of the number of nitrogen atoms to the total number of atoms constituting the compound, is suitable to provide an organic electroluminescence device having high electron injection properties and high driving stability.

A polyamine that can be formed into a layer by application is preferred, and may be a low-molecular compound or a high-molecular compound. The low-molecular compound is preferably a polyalkyleneamine such as diethylenetriamine or pentamethyldiethylenetriamine. The high-molecular compound is preferably a polymer having a polyalkyleneimine structure. Polyethyleneimine is particularly preferred. Among them, it is a preferred embodiment of the present invention that the nitrogen-containing compound is polyethylenimine or diethylenetriamine.

The term "low-molecular compound" herein means a compound that is not a high-molecular compound (polymer), and does not necessarily mean a compound having a low molecular weight.

It is a preferred embodiment of the present invention that a branched polymer having a polyalkyleneimine structure as a main chain is used among the above polyamines.

It is also a preferred embodiment of the present invention that a linear polymer having a polyalkyleneimine structure as a main chain is used among the above polyamines.

Use of a polymer having a branched structure or a linear structure as a main chain as the polyamine can lead to a device having better driving stability and better lifetime. This is presumably because the polymer having a polyalkyleneimine structure as a main chain is stable in the device.

A nitrogen-containing film formed from such a branched or linear polymer having a polyalkyleneimine structure as a main chain and disposed adjacent to the metal oxide layer is the nitrogen-containing film (1).

The linear polymer having a polyalkyleneimine structure as a main chain may have a branched part as long as large part of the polyalkyleneimine structure of the main chain is in the form of a linear chain. In the linear polymer, 90% or more of the polyalkyleneimine structure of the main chain is in the form of a linear chain. Preferably, 95% or more of the polyalkyleneimine structure is in the form of a linear chain, and most preferably, 100% of the polyalkyleneimine structure of the main chain is in the form of a linear chain.

The branched polymer having a polyalkyleneimine structure as a main chain is a branched polyalkyleneimine in which the branched part occupies 10% or more of the polymer.

The polyalkyleneimine structure of the polymer having a polyalkyleneimine structure is preferably formed from a C2-C4 alkyleneimine. It is more preferably formed from a C2 or C3 alkyleneimine.

The polymer having a polyalkyleneimine structure is one having a polyalkyleneimine structure as a main chain. It may be a copolymer further having a structure other than the polyalkyleneimine structure.

When the polymer having a polyalkyleneimine structure further has a structure other than the polyalkyleneimine structure, a monomer forming the structure other than the polyalkyleneimine structure is, for example, ethylene, propylene, butene, acetylene, acrylic acid, styrene, or vinylcarbazole. These may be used alone or in combination of two or more thereof. Suitably, the monomer may also be a substance prepared by replacing a hydrogen atom bonded to any carbon atom in any of these monomers by another organic group. Examples of the organic group that replaces a hydrogen atom include C1-C10 hydrocarbon groups optionally containing at least one atom selected from the group consisting of an oxygen atom, a nitrogen atom, and a sulfur atom.

The polymer having a polyalkyleneimine structure preferably contains a monomer forming the polyalkyleneimine structure in an amount of 50% by mass or more based on 100% by mass of the monomer component constituting the main chain of the polymer. The amount is more preferably 66% by mass or more, still more preferably 80% by mass or more. Most preferably, the amount of the monomer constituting the polyalkyleneimine structure is 100% by mass, i.e., the polymer having a polyalkyleneimine structure is a polyalkyleneimine homopolymer.

The polymer having a polyalkyleneimine structure preferably has a weight average molecular weight of 100000 or less. An organic electroluminescence device including a layer formed by heating the polymer having such a weight average molecular weight at a temperature at which the polymer decomposes can have better driving stability. When the polymer having a polyalkyleneimine structure such as polyethylenimine is the above-described branched polymer, the polymer more preferably has a weight average molecular weight of 10000 or less, still more preferably 100 to 1000.

When the polymer having a polyalkyleneimine structure is the above-described linear polymer, the polymer more preferably has a weight average molecular weight of 250000 or less, still more preferably greater than 10000 and 50000 or less, particularly preferably greater than 10000 and less than 25000. The weight average molecular weight can be measured by gel permeation chromatography (GPC) under the following conditions.

Measuring apparatus: Waters Alliance (2695) (product name, available from Waters)

Molecular weight column: TSK guard column α, TSK gel α-3000, TSK gel α-4000, and TSK gel α-5000 (all available from Tosoh Corporation) connected in series Eluent: a solution in which 96 g of a 50 mM aqueous sodium hydroxide solution and 3600 g of acetonitrile are mixed in 14304 g of a 100 mM aqueous boric acid solution Standard substance for calibration curve: polyethylene glycol (available from Tosoh Corporation)

Measurement method: an object to be measured is dissolved in the eluent in such a manner that the solid content is about 0.2% by mass, and the filtrate that has passed through a filter is used as a measurement sample for molecular weight measurement.

Decomposition of the nitrogen-containing compound on the metal oxide layer leads to the nitrogen-containing film (3) or the high nitrogen-containing film (4). Use of a high nitrogen content compound such as a polyamine as the nitrogen-containing compound enables more dense deposition of the decomposed nitrogen-containing compound on the metal oxide layer. The present invention encompasses such a nitrogen-containing thin film on the metal oxide.

The nitrogen-containing film may be formed by any method. It is preferably formed by a method including vapor deposition of the nitrogen-containing compound or a method including application of a solution containing the nitrogen-containing compound to the metal oxide layer. More preferred is a method including application of a solution containing the nitrogen-containing compound to the metal oxide layer. The formation of the nitrogen-containing film by the method including application of a solution containing the nitrogen-containing compound to the metal oxide layer is advantageous for obtaining the following effects.

The metal oxide layer of the organic electroluminescence device is formed by a method such as a spray pyrolysis method, a sol-gel method, or a sputtering method as described later, and the surface of the layer is not smooth and is irregular. Some types of a component used as the material of an emitting layer formed on the metal oxide layer by a method such as vacuum deposition may cause irregularities of the surface of the metal oxide layer to act as crystal nuclei, which promotes crystallization of the material forming the emitting layer in contact with the metal oxide layer. This causes a high leakage current flow and non-uniform luminance of the light emitting surface in the resulting organic electroluminescence device. This device may not withstand practical use.

On the other hand, a layer formed by applying the solution has a smooth surface. A nitrogen-containing compound layer formed by application between the metal oxide layer and the emitting layer can suppress crystallization of the material forming the emitting layer.

Thereby, an organic electroluminescence device having a metal oxide layer with suppressed leakage current and uniform surface emission can be obtained.

When the nitrogen-containing compound is a polyamine, water or a lower alcohol may be used as a solvent of the solution containing the nitrogen-containing compound. The lower alcohol is preferably a C1-C4 alcohol such as methanol, ethanol, propanol, ethoxy ethanol, or methoxy ethanol. These may be used alone or as a mixture of two or more thereof.

When the nitrogen-containing film is formed by a method including application of a solution containing the nitrogen-containing compound, the concentration of the nitrogen-containing compound in the solution is preferably 0.01 to 1% by mass, more preferably 0.05 to 0.5% by mass, still more preferably 0.1 to 0.3% by mass, but is not limited thereto.

When the nitrogen-containing film is formed by a method including application of a solution containing the nitrogen-containing compound, it can be formed by any of various application methods such as spin coating, casting, micro gravure coating, gravure coating, bar coating, roll coating, wire bar coating, slit coating, dip coating, spray coating, screen printing, flexographic printing, offset printing, and inkjet printing. Preferred among these are spin coating and slit coating because the thickness of the resulting film can be easily controlled.

After the solution containing the nitrogen-containing compound is applied, rinse with a solvent or ultrasonic washing may be performed.

The solvent used for the rinse may be any one or more of solvents such as water, ethanol, and methoxy ethanol.

The application of the solution containing the nitrogen-containing compound, the rinse with a solvent, and the ultrasonic washing may be performed in air or in an inert gas atmosphere. An inert gas atmosphere is preferred. These processes performed in an inert gas atmosphere lead to a device having much better luminance and lifetime.

Examples of a usable inert gas include helium, nitrogen, and argon.

The nitrogen-containing films (3) and (4) may be formed by any method for decomposing the nitrogen-containing compound as long as the nitrogen-containing compound is decomposed on the metal oxide layer. The nitrogen-containing compound is preferably decomposed by heating.

When the nitrogen-containing compound is decomposed by heating, the metal atoms in the metal oxide layer and the nitrogen atoms are strongly bonded. Thereby, an organic electroluminescence device obtained can exhibit high driving stability for a longer time can be obtained.

In a preferred embodiment of the present invention, the nitrogen-containing film is formed by decomposition of the nitrogen-containing compound by heating.

Accordingly, the nitrogen-containing film is most preferably formed by application of a solution containing the nitrogen-containing compound to the metal oxide layer, followed by decomposition of the nitrogen-containing compound by heating. The thus-formed nitrogen-containing film can suppress leakage current, give uniform surface emission, and provide an organic electroluminescence device that can exhibit high driving stability for a longer time.

The present invention also encompasses such a method for producing a HOILED device, that is, a method for producing an organic electroluminescence device including a structure in which a plurality of layers is laminated between an anode and a cathode formed on a substrate. The method includes the steps of: applying a solution containing a nitrogen-containing compound to a metal oxide layer, removing a solvent from a coating film of the nitrogen-containing compound, and heating the nitrogen-containing compound at a temperature at which the nitrogen-containing compound decomposes to produce the nitrogen-containing film layer of the present invention.

A preferred embodiment of the application of the solution containing the nitrogen-containing compound in the method for producing the organic electroluminescence device of the present invention is as described above. The method may optionally include rinse with the above-described solvent or ultrasonic washing.

In removing a solvent from a coating film of the nitrogen-containing compound, the solvent is preferably removed by heating. The removal of components such as the solvent from the film by heating can provide a more stable film structure.

The solvent is preferably removed by heating at 80° C. to 180° C., more preferably at 100° C. to 150° C.

In order to decompose the nitrogen-containing compound or to remove components such as the solvent from the film to provide a more stable film structure, the heating (annealing) is preferably performed at 80° C. to 200° C. Also, the heating is preferably performed for 1 to 60 minutes, more preferably 5 to 20 minutes.

The heating temperature and the heating time may be appropriately set within the above ranges depending on the type of the nitrogen-containing compound. For example, since the decomposition temperature of a polymer increases as the molecular weight of the polymer increases, when the nitrogen-containing compound is the polymer having a polyalkyleneimine structure as a main chain, the heating temperature and the heating time can be appropriately set with reference to the heating conditions described in the Examples below while considering the molecular weight of the polymer.

The heating for decomposition of the nitrogen-containing compound may be performed in air or in an inert gas atmosphere.

Whether or not the nitrogen-containing compound decomposes can be confirmed by X-ray photoelectron spectroscopy (XPS) measurement.

The organic electroluminescence device of the present invention includes an anode, a cathode, an organic compound layer consisting of a single layer or multiple layers between the anode and the cathode, and a metal oxide layer between the cathode and the organic compound layer. Preferably, it further includes the nitrogen-containing film layer in the present invention between the metal oxide layer and the organic compound layer. The organic compound layer includes an emitting layer and, optionally, other layers such as an electron transport layer and a hole transport layer.

In particular, the organic electroluminescence device of the present invention preferably is an organic-inorganic hybrid organic electroluminescence device including a cathode adjacent to and disposed on a substrate and a metal oxide layer between an anode and the cathode, wherein the organic electroluminescence device includes an emitting layer, the anode, an electron injection layer and an optional electron transport layer between the cathode and the emitting layer, and a hole transport layer and/or a hole injection layer between the anode and the emitting layer. The organic electroluminescence device of the present invention may further include other layers between any of these layers. Still, it preferably consists of only these layers. In other words, a device is preferred in which a cathode, an electron injection layer, an optional electron transport layer, an emitting layer, a hole transport layer and/or a hole injection layer, and an anode are laminated adjacent to each other in this order. Each of these layers may have a monolayer or multilayer structure.

Since the nitrogen-containing film has excellent electron injection properties as described above, it is preferably disposed on an electron injection side, that is, on a cathode side. The metal oxide layer is preferably laminated as part of the cathode or as a layer constituting the electron injection layer and/or as part of the anode or as a layer constituting the hole injection layer as described later.

When the organic electroluminescence device having the above structure includes no electron transport layer, the electron injection layer and the emitting layer are adjacent to each other. When the device includes either the hole transport layer or the hole injection layer, the layer that is present is adjacent to the emitting layer and the anode. When the device includes both the hole transport layer and the hole injection layer, the emitting layer, the hole transport layer, the hole injection layer, and the anode are laminated adjacent to each other in this order.

The emitting layer in the organic electroluminescence device of the present invention may be formed from any of compounds commonly used as a material of an emitting layer. The compound may be a low-molecular compound, a high-molecular compound, or a mixture thereof.

The term "low-molecular material" herein means a material that is not a high-molecular material (polymer), and does not necessarily means an organic compound having a low molecular weight.

Examples of the high-molecular material of the emitting layer include polyacetylene compounds such as trans-polyacetylene, cis-polyacetylene, poly(di-phenylacetylene) (PDPA), and poly(alkyl, phenylacetylene) (PAPA); polyparaphenylenevinylene compounds such as poly(para-phenylenevinylene) (PPV), poly(2,5-dialkoxy-para-phenylenevinylene) (RO-PPV), cyano-substituted poly(para-phenylenevinylene) (CN-PPV), poly(2-dimethyloctylsilyl-para-phenylenevinylene) (DMOS-PPV), and poly(2-methoxy, 5-(2'-ethylhexoxy)-para-phenylenevinylene) (MEH-PPV); polythiophene compounds such as poly(3-alkylthiophene) (PAT) and poly(oxypropylene)triol (POPT); polyfluorene compounds such as poly(9,9-dialkylfluorene) (PDAF), poly(dioctylfluorene-alt-benzothiadiazole) (F8BT), α, ω-bis[N,N'-di(methylphenyl)aminophenyl]-poly[9,9-bis(2-ethylhexyl)fluorene-2,7-diyl] (PF2/6am4), and poly(9,9-dioctyl-2,7-divinylenefluorenyl)-ortho-co(anthracene-9,10-diyl); polyparaphenylene compounds such as poly(para-phenylene) (PPP) and poly(1,5-dialkoxy-para-phenylene) (RO-PPP); polycarbazole compounds such as poly(N-vinylcarbazole) (PVK); polysilane compounds such as poly(methylphenylsilane) (PMPS), poly(naphthylphenylsilane) (PNPS), and poly(biphenylphenylsilane) (PBPS); and boron compound high-molecular materials disclosed in Japanese Patent Application No. 2010-230995 and Japanese Patent Application No. 2011-6457.

Examples of the low-molecular material of the emitting layer include various metal complexes such as a tridentate iridium complex containing 2,2'-bipyridine-4,4'-dicarboxylic acid as a ligand, fac-tris(2-phenylpyridine) iridium (Ir(ppy)$_3$), 8-hydroxyquinoline aluminum (Alq$_3$), tris(4-methyl-8-quinolinolate)aluminum (III) (Almq$_3$), 8-hydroxyquinoline zinc (Znq$_2$), (1,10-phenanthroline)-tris-(4,4,4-trifluoro-1-(2-thienyl)-butane-1,3-dionate)europium (III) (Eu(TTA)$_3$(phen)), and 2,3,7,8,12,13,17,18-octaethyl-21H, 23H-porphin platinum (II); benzene compounds such as distyrylbenzene (DSB) and diaminodistyrylbenzene (DADSB); naphthalene compounds such as naphthalene and Nile red; phenanthrene compounds such as phenanthrene; chrysene compounds such as chrysene and 6-nitrochrysene; perylene compounds such as perylene and N,N'-bis(2,5-di-t-butylphenyl)-3,4,9,10-perylene-di-carboxyimide (BPPC); coronene compounds such as coronene; anthracene compounds such as anthracene and bisstyrylanthracene; pyrene compounds such as pyrene; pyran compounds such as 4-(di-cyanomethylene)-2-methyl-6-(para-dimethylaminostyryl)-4H-pyran (DCM); acridine compounds such as acridine; stilbene compounds such as stilbene; thiophene compounds such as 2,5-dibenzoxazolethiophene; benzoxazole compounds such as benzoxazole; benzimidazole compounds such as benzimidazole; benzothiazole compounds such as 2,2'-(para-phenylenedivinylene)-bisbenzothiazole; butadiene compounds such as bistyryl(1,4-diphenyl-1,3-butadiene) and tetraphenylbutadiene; naphthalimide compounds such as naphthalimide; coumarin compounds such as coumarin; perynone compounds such as perynone; oxadiazole compounds such as oxadiazole; aldazine compounds; cyclopentadiene compounds such as 1,2,3,4,5-pentaphenyl-1,3-cyclopentadiene (PPCP); quinacridone compounds such as quinacridone and quinacridone red; pyridine compounds such as pyrrolopyridine and thiadiazolopyridine; spiro compounds such as 2,2',7,7'-tetraphenyl-9,9'-spirobifluorene; metallic or non-metallic phthalocyanine compounds such as phthalocyanine (H$_2$Pc) and copper phthalocyanine; and boron compound materials disclosed in JP 2009-155325 A, Japanese Patent Application No. 2010-230995, and Japanese Patent Application No. 2011-6458.

The emitting layer preferably has any average thickness. The average thickness is preferably 10 to 150 nm, more preferably 20 to 100 nm, still more preferably 40 to 100 nm.

The average thickness of the emitting layer can be measured with a quartz crystal film thickness meter in the case of a low-molecular compound, or with a contact-type step profiler in the case of a high-molecular compound.

The electron transport layer, if present, in the organic electroluminescence device of the present invention may be formed from any of compounds that can be commonly used as a material of an electron transport layer or may be formed from a mixture of these compounds.

Examples of the compounds that can be used as a material of the electron transport layer include pyridine derivatives such as tris-1,3,5-(3'-(pyridin-3"-yl)phenyl)benzene (TmPyPhB); quinoline derivatives such as (2-(3-(9-carbazolyl) phenyl)quinoline (mCQ)); pyrimidine derivatives such as 2-phenyl-4,6-bis(3,5-dipyridylphenyl)pyrimidine (BPyPPM); pyrazine derivatives; phenanthroline derivatives such as bathophenanthroline (BPhen); triazine derivatives such as 2,4-bis(4-biphenyl)-6-(4'-(2-pyridinyl)-4-biphenyl)-[1,3,5]triazine (MPT); triazole derivatives such as 3-phenyl-4-(1'-naphthyl)-5-phenyl-1,2,4-triazole (TAZ); oxazole derivatives; oxadiazole derivatives such as 2-(4-biphenyl)-5-(4-tert-butylphenyl-1,3,4-oxadiazole) (PBD); imidazole derivatives such as 2,2',2"-(1,3,5-benzenetriyl)-tris(1-phenyl-1-H-benzimidazole) (TPBI); aromatic ring tetracarboxylic anhydrides such as naphthalene and perylene; various metal complexes such as bis[2-(2-hydroxyphenyl)benzothiazolato]zinc (Zn(BTZ)$_2$) and tris(8-hydroxyquinolinato)aluminum (Alq$_3$); and organic silane derivatives typified by silole derivatives such as 2,5-bis(6'-(2',2"-bipyridyl))-1,1-dimethyl-3,4-diphenylsilole (PyPySPyPy). These may be used alone or in combination of two or more thereof.

Preferred among these are metal complexes such as $Alq_3$ and pyridine derivatives such as TmPyPhB.

The hole transport layer, if present, in the organic electroluminescence device of the present invention may be formed from an organic material having hole transport properties such as a p-type high-molecular material or a p-type low-molecular material. The p-type high-molecular material and the p-type low-molecular material may be used alone or in combination.

Examples of the p-type high-molecular material (organic polymer) include a polyarylamine, a fluorene-arylamine copolymer, a fluorene-bithiophene copolymer, poly(N-vinylcarbazole), polyvinylpyrene, polyvinylanthracene, polythiophene, a polyalkylthiophene, polyhexylthiophene, poly (p-phenylenevinylene), polythienylenevinylene, pyrene-formaldehyde resin, ethylcarbazole-formaldehyde resin, and derivatives thereof. Each of these compounds may be used as a mixture with other compounds. For example, a mixture containing polythiophene may be exemplified by poly(3,4-ethylenedioxythiophene/styrenesulfonate) (PEDOT/PSS).

Examples of the p-type low-molecular material include arylcycloalkane compounds such as 1,1-bis(4-di-para-triaminophenyl)cyclohexane and 1,1'-bis(4-di-para-tolylaminophenyl)-4-phenyl-cyclohexane; arylamine compounds such as 4,4',4"-trimethyltriphenylamine, tetraphenyl-1,1'-biphenyl-4,4'-diamine, N,N'-diphenyl-N,N'-bis(3-methylphenyl)-1,1'-biphenyl-4,4'-diamine (TPD1), N,N'-diphenyl-N,N'-bis(4-methoxyphenyl)-1,1'-biphenyl-4,4'-diamine (TPD2), N,N,N',N'-tetrakis(4-methoxyphenyl)-1,1'-biphenyl-4,4'-diamine (TPD3), N,N'-di(1-naphthyl)-N,N'-diphenyl-1,1'-biphenyl-4,4'-diamine ($\alpha$-NPD), and TPTE; phenylenediamine compounds such as N,N,N',N'-tetraphenyl-para-phenylenediamine, N,N,N',N'-tetra(para-tolyl)-para-phenylenediamine, and N,N,N,N'-tetra(meta-tolyl)-meta-phenylenediamine (PDA); carbazole compounds such as carbazole, N-isopropylcarbazole, and N-phenylcarbazole; stilbene compounds such as stilbene and 4-di-para-tolylaminostilbene; oxazole compounds such as $O_xZ$; triphenylmethane compounds such as triphenylmethane and m-MTDATA; pyrazoline compounds such as 1-phenyl-3-(para-dimethylaminophenyl)pyrazoline; benzine(cyclohexadiene) compounds; triazole compounds such as triazole; imidazole compounds such as imidazole; oxadiazole compounds such as 1,3,4-oxadiazole and 2,5-di(4-dimethylaminophenyl)-1,3,4-oxadiazole; anthracene compounds such as anthracene and 9-(4-diethylaminostyryl) anthracene; fluorenone compounds such as fluorenone, 2,4,7-trinitro-9-fluorenone, and 2,7-bis(2-hydroxy-3-(2-chlorophenylcarbamoyl)-1-naphthylazo) fluorenone; aniline compounds such as polyaniline; silane compounds; pyrrole compounds such as 1,4-dithioketo-3,6-diphenyl-pyrrolo-(3,4-c)pyrrolopyrrole; fluorene compounds such as fluorene; porphyrin compounds such as porphyrin and metal tetraphenylporphyrin; quinacridon compounds such as quinacridon; metallic or non-metallic phthalocyanine compounds such as phthalocyanine, copper phthalocyanine, tetra(t-butyl)copper phthalocyanine, and iron phthalocyanine; metallic or non-metallic naphthalocyanine compounds such as copper naphthalocyanine, vanadyl naphthalocyanine, and monochloro gallium naphthalocyanine; and benzidine compounds such as N,N'-di(naphthalen-1-yl)-N,N'-diphenyl-benzidine and N,N,N',N'-tetraphenyl-benzidine.

The electron transport layer and the hole transport layer, if present, in the organic electroluminescence device of the present invention may each have any average thickness. The average thickness is preferably 10 to 150 nm, more preferably 20 to 100 nm, still more preferably 40 to 100 nm.

The average thicknesses of the electron transport layer and the hole transport layer can be measured with a quartz crystal film thickness meter in the case of a low-molecular compound, or with a contact-type step profiler in the case of a high-molecular compound.

The organic electroluminescence device of the present invention includes the metal oxide layer between the cathode and the emitting layer and/or between the anode and the emitting layer, and it preferably includes the metal oxide layer both between the cathode and the emitting layer and between the emitting layer and the anode. When the metal oxide layer between the cathode and the emitting layer is defined as a first metal oxide layer and the metal oxide layer between the anode and the emitting layer is defined as a second metal oxide layer, an exemplary preferred organic electroluminescence device of the present invention includes a laminate of the cathode, the first metal oxide layer, the nitrogen-containing film layer, the emitting layer, the hole transport layer, the second metal oxide layer, and the anode, which are adjacent to each other in this order. The organic electroluminescence device may optionally include an electron transport layer between the nitrogen-containing film layer and the emitting layer. As for the importance of the metal oxide layers, the first metal oxide layer is more important than the second metal oxide layer, and the second metal oxide layer can be replaced by an organic material having an extremely deep lowest unoccupied molecular orbital level (e.g., HATCN).

The first metal oxide layer is a layer of a thin semiconductive or insulating film consisting of one single-metal oxide film, or a layer of thin semiconductive or insulating films consisting of a laminate and/or a mixture of single-metal oxides or multiple-metal oxides. The metal element constituting the metal oxide is selected from the group consisting of magnesium, calcium, strontium, barium, titanium, zirconium, hafnium, vanadium, niobium, tantalum, chromium, molybdenum, tungsten, manganese, indium, gallium, iron, cobalt, nickel, copper, zinc, cadmium, aluminum, and silicon. The layer consisting of a laminate or a mixture of metal oxides preferably includes a layer formed from at least one metal element selected from magnesium, aluminum, calcium, zirconium, hafnium, silicon, titanium, or zinc among the metal elements mentioned above. In the case of the layer consisting of single-metal oxides, the layer preferably includes a metal oxide selected from the group consisting of magnesium oxide, aluminum oxide, zirconium oxide, hafnium oxide, silicon oxide, titanium oxide, and zinc oxide.

Examples of the layer consisting of a laminate and/or a mixture of single-metal oxides or multiple-metal oxides include layers in which the following combinations of metal oxides are laminated and/or mixed: titanium oxide/zinc oxide, titanium oxide/magnesium oxide, titanium oxide/zirconium oxide, titanium oxide/aluminum oxide, titanium oxide/hafnium oxide, titanium oxide/silicon oxide, zinc oxide/magnesium oxide, zinc oxide/zirconium oxide, zinc oxide/hafnium oxide, zinc oxide/silicon oxide, calcium oxide/aluminum oxide, and the like. Examples thereof also include layers in which the following combinations of three kinds of metal oxides are laminated and/or mixed: titanium oxide/zinc oxide/magnesium oxide, titanium oxide/zinc oxide/zirconium oxide, titanium oxide/zinc oxide/aluminum oxide, titanium oxide/zinc oxide/hafnium oxide, titanium oxide/zinc oxide/silicon oxide, indium oxide/gallium oxide/ zinc oxide, and the like. The above examples also include IGZO (an oxide semiconductor) and $12CaO_7Al_2O_3$ (an electride) which have special compositions and exhibit good properties.

The first metal oxide layer also serves as an electron injection layer or an electrode (cathode).

In the present invention, those having a sheet resistance of less than 100Ω/□ are classified as conductors, and those having a sheet resistance of not less than 100Ω/□ are classified as semiconductors or insulators. Thus, thin films known as transparent electrodes such as tin-doped indium oxide (ITO), antimony-doped indium oxide (ATO), indium-doped zinc oxide (IZO), aluminum-doped zinc oxide (AZO), and fluorine-doped indium oxide (FTO) are highly conductive and do not fall into the category of the semiconductor or insulator. Thus, these thin films do not meet the definition of a film constituting the first metal oxide layer of the present invention.

The second metal oxide layer may be formed from any metal oxide, and examples of the metal oxide include vanadium oxide ($V_2O_5$), molybdenum oxide ($MoO_3$), tungsten oxide ($WO_3$), and ruthenium oxide ($RuO_2$). These may be used alone or in combination of two or more thereof. Among these, vanadium oxide or molybdenum oxide is preferably used as a main component. The second metal oxide layer containing vanadium oxide or molybdenum oxide as a main component has an excellent function as a hole injection layer that the second metal oxide layer injects holes from the anode and transports the holes to the emitting layer or to the hole transport layer. Another advantage is that vanadium oxide and molybdenum oxide inherently have high hole transportability so that they can suitably prevent a decrease in injection efficiency of holes from the anode to the emitting layer or to the hole transport layer. More preferably, the second metal oxide layer is formed from vanadium oxide and/or molybdenum oxide.

The first metal oxide layer may have an average thickness ranging from 1 nm to about several micrometers. In order to obtain an organic electroluminescence device that can operate at low voltages, the average thickness is preferably 1 to 1000 nm, more preferably 2 to 100 nm.

The second metal oxide layer may have any average thickness. The average thickness is preferably 1 to 1000 nm, more preferably 5 to 50 nm.

The average thickness of the first metal oxide layer can be measured with a probe-type step profiler or by spectroscopic ellipsometry.

The average thickness of the second metal oxide layer can be measured with a quartz crystal film thickness meter during film formation.

The anode and the cathode in the organic electroluminescence device of the present invention each may be formed from a known appropriate conductive material. In order to extract light, at least one of them is preferably transparent. Examples of a known transparent conductive material include tin-doped indium oxide (ITO), antimony-doped indium oxide (ATO), indium-doped zinc oxide (IZO), aluminum-doped zinc oxide (AZO), and fluorine-doped indium oxide (FTO). Examples of an opaque conductive material include calcium, magnesium, aluminum, tin, indium, copper, silver, gold, and platinum, and alloys thereof.

The cathode is preferably ITO, IZO, or FTO among these.

The anode is preferably Au, Ag, or Al among these.

As described above, metals commonly used for an anode can be used for the cathode and the anode, so that a top emission structure in which light is to be extracted from the upper electrode can be readily achieved, and various types of the electrodes can be selected and used for each electrode. For example, Al may be used for the lower electrode, and ITO may be used for the upper electrode.

The cathode may have any average thickness. The average thickness is preferably 10 to 500 nm, more preferably 100 to 200 nm. The average thickness of the cathode can be measured with a probe-type step profiler or by spectroscopic ellipsometry.

The anode may have any average thickness. The average thickness is preferably 10 to 1000 nm, more preferably 30 to 150 nm. An opaque material can be used as an anode for the top emission type device and the transparent type device when the average thickness of the opaque material is about 10 to 30 nm.

The average thickness of the anode can be measured with a quartz crystal film thickness meter during film formation.

The organic compound layer in the organic electroluminescence device of the present invention may be formed by any method. An appropriate method may be selected from various methods according to the properties of the material. When the material can be applied in the form of a solution, various application methods can be employed such as spin coating, casting, micro gravure coating, gravure coating, bar coating, roll coating, wire bar coating, slit coating, dip coating, spray coating, screen printing, flexographic printing, offset printing, and inkjet printing. Preferred among these are spin coating and slit coating because they easily control the thickness of the layer. When the material is not applied or is less soluble in a solvent, vacuum deposition and evaporative spray deposition from ultra-dilute solution (ES-DUS) are suitable, for example.

When the organic compound layer is formed by applying an organic compound solution, inorganic solvents and various organic solvents can be used to dissolve the organic compound. Examples of the inorganic solvents include nitric acid, sulfuric acid, ammonia, hydrogen peroxide, water, carbon disulfide, carbon tetrachloride, and ethylene carbonate. Examples of the organic solvents include ketone solvents such as methyl ethyl ketone (MEK), acetone, diethyl ketone, methyl isobutyl ketone (MIBK), methyl isopropyl ketone (MIPK), and cyclohexanone; alcohol solvents such as methanol, ethanol, isopropanol, ethylene glycol, diethylene glycol (DEG), and glycerine; ether solvents such as diethyl ether, diisopropyl ether, 1,2-dimethoxy ethane (DME), 1,4-dioxane, tetrahydrofuran (THF), tetrahydropyran (THP), anisole, diethylene glycol dimethyl ether (diglyme), and diethylene glycol ethyl ether (carbitol); cellosolve solvents such as methyl cellosolve, ethyl cellosolve, and phenyl cellosolve; aliphatic hydrocarbon solvents such as hexane, pentane, heptane, and cyclohexane; aromatic hydrocarbon solvents such as toluene, xylene, and benzene; aromatic heterocyclic compound solvents such as pyridine, pyrazine, furan, pyrrole, thiophene, and methylpyrrolidone; amide solvents such as N,N-dimethylformamide (DMF) and N,N-dimethylacetamide (DMA); halogenated compound solvents such as chlorobenzene, dichloromethane, chloroform, and 1,2-dichloroethane; ester solvents such as ethyl acetate, methyl acetate, and ethyl formate; sulfur compound solvents such as dimethyl sulfoxide (DMSO) and sulfolane; nitrile solvents such as acetonitrile, propionitrile, and acrylonitrile; and organic acid solvents such as formic acid, acetic acid, trichloroacetic acid, and trifluoroacetic acid. Also, solvent mixtures containing these solvents may be used.

Preferred among these solvents are non-polar solvents, and examples thereof include aromatic hydrocarbon solvents such as xylene, toluene, cyclohexylbenzene, dihydrobenzofuran, trimethylbenzene, and tetramethylbenzene, aromatic heterocyclic compound solvents such as pyridine, pyrazine, furan, pyrrole, thiophene, and methylpyrrolidone, and aliphatic hydrocarbon solvents such as hexane, pentane, heptane, and cyclohexane. These may be used alone or as a mixture of two or more thereof.

The cathode, the anode, and the oxide layer can be formed by a method such as a sputtering method, a vacuum deposition method, a sol-gel method, a spray pyrolysis deposition (SPD) method, an atomic layer deposition (ALD) method, a vapor phase deposition method, or a liquid phase deposition method. The cathode and the anode may also be formed by joining metal foil. A method suitable for each layer may be selected from these methods according to the properties of the material of the layer. These layers may be formed by different methods. The second metal oxide layer is more preferably formed by vapor phase deposition among these methods. The vapor phase deposition enables the clean formation of the second metal oxide layer without destroying the surface of the organic compound layer and in good contact with the anode. As a result, the effects owing to the presence of the second metal oxide layer are more significantly achieved.

In order to further enhance the properties of the organic electroluminescence device of the present invention, the organic electroluminescence device may further include, if necessary, a hole blocking layer and an electron blocking layer, for example. These layers may be formed from materials commonly used to form these layers and may be formed by a method commonly used to form these layers.

The organic electroluminescence device of the present invention requires less strict sealing than an organic electroluminescence device in which all the layers constituting the device are formed from organic compounds. It may be sealed, if necessary. The sealing may be appropriately performed by a common method. Examples of the method include bonding of a sealing container in an inert gas and direct formation of a sealing film on an organic EL device. These methods may be performed in combination with sealing of a water absorber.

The organic electroluminescence device of the present invention is an inverted organic electroluminescence device including a cathode adjacent to and disposed on a substrate. The organic electroluminescence device of the present invention may be of a top emission type in which light is emitted toward the opposite side of the substrate, or may be of a bottom emission type in which light is emitted toward the substrate.

Examples of materials of the substrate include resin materials such as polyethylene terephthalate, polyethylene naphthalate, polypropylene, a cycloolefin polymer, a polyamide, polyethersulfone, polymethyl methacrylate, polycarbonate, and polyarylate; and glass materials such as silica glass and soda glass. These may be used alone or in combination of two or more thereof.

In the case of the top emission type, the substrate may be an opaque substrate. For example, it may be a substrate formed from a ceramic material such as alumina, a metal substrate such as stainless steel provided with an oxide film (insulating film) on the surface, or a substrate formed from a resin material.

The substrate preferably has an average thickness of 0.1 to 30 mm, more preferably 0.1 to 10 mm.

The average thickness of the substrate can be measured with a digital multimeter or a caliper.

When voltage (usually, 15 V or less) is applied between the anode and the cathode, the organic electroluminescence device of the present invention can emit light. Usually, a direct current voltage is applied. It may include an alternating current component.

The organic electroluminescence device of the present invention can vary the color of light by appropriate selection of the materials of the organic compound layer and can achieve light with a desired color by using a color filter or the like in combination. Thus, the organic electroluminescence device of the present invention can be suitably used as an emitting unit of a display device or in a lighting system. In particular, owing to the properties of an inverted type, the organic electroluminescence device of the present invention is suitably used in a display device in combination with oxide TFTs.

The present invention also encompasses such a display device including the organic electroluminescence device of the present invention and such a lighting system including the organic electroluminescence device of the present invention.

As described above, the organic electroluminescence device of the present invention including the nitrogen-containing film layer on the metal oxide layer has improved electron injection properties, and thus has excellent luminous efficiency, excellent driving stability, and excellent lifetime. The improvement in electron injection properties is beneficial to improve the performance of not only organic electroluminescence devices, but also photoelectron devices such as solar cells and organic semiconductors.

EXAMPLES

The present invention is described in more detail with reference to examples below, but the present invention is not limited to these examples. Herein, "part(s)" means "part(s) by weight" and "%" means "% by mass" unless otherwise stated.

The thickness of a nitrogen-containing film was determined by the following method.

Since the nitrogen-containing film is very thin, the thickness thereof is difficult to determine by a method using a common contact-type step profiler. Thus, it was calculated by X-ray photoelectron spectroscopy. This calculation method, which is used in Ketul C Popat and two others, "Journal of Physical Chemistry B", Vol. 108, 2004, pp. 5185, is an established method. The thickness of the nitrogen-containing film was calculated using the following equation (1) ("X-sen koudenshi bunkou (X-ray photoelectron spectroscopy)", Maruzen Co., Ltd.).

$$\left(\frac{I_i}{I_i^0}\right)_Z = \int_0^{Z1-Z} X_i(Z')\frac{1}{\lambda_i}\exp\left(-\frac{Z'}{\lambda_i}\right)dz = X_i\left[1 - \exp\left(-\frac{Z_1-Z}{\lambda_{i,i}}\right)\right] \quad (1)$$

In the equation, $I_i$ is the nitrogen 1 s orbital strength of an unknown sample, $I_i^0$ is the nitrogen is orbital strength of a standard sample including a nitrogen-containing substance used to form a film, $X_i$ is a mole fraction, $Z'$ is the depth from the surface of a sample, $\lambda_i$ is the escape depth of a photoelectron of an element i, $\lambda_{i,i}$ is the inelastic mean free path, and $Z_1-Z$ is the thickness of a film.

The X-ray photoelectron spectroscopy measurement was performed using a photoelectron spectrometer (AXIS-NOVA) available from Shimazu-Kratos under the following conditions.

X-ray source: AlKα
Beam output: 100 W

Pass Energy: 40 eV
Step: 0.1 eV
(Production of Organic Electroluminescence Device and Evaluation of Properties of Organic Electroluminescence Device)

Example 1

[1] A commercially available transparent glass substrate 1 having an average thickness of 0.7 mm with an ITO electrode layer was prepared. The substrate was provided with an ITO electrode 2 patterned to have a width of 2 mm. The substrate was rinsed with ultrapure water, followed by ultrasonic washing in a diluted solution of Clean Ace twice each for 5 minutes. Thereafter, the substrate was ultrasonically washed in ultrapure water twice each for 5 minutes, followed by ultrasonic washing in acetone and isopropanol each for 10 minutes. Then, the substrate was boiled in isopropanol for 5 minutes. The substrate was taken out from isopropanol, dried by nitrogen blow, and washed with UV ozone for 20 minutes.

[2] The substrate was fixed again to a substrate holder of a mirrortron sputtering apparatus having zinc metal targets. The pressure was reduced to about $5 \times 10^{-5}$ Pa, and then sputtering was performed while introducing argon and oxygen. Thus, a zinc oxide layer having a thickness of about 2 nm was produced as a first metal oxide layer 3.

In this step, a metal mask was used to prevent formation of a zinc oxide film on part of the ITO electrode for leading out electrodes.

[3] The substrate was ultrasonically washed in ultrapure water for 15 minutes, followed by ultrasonic washing in acetone and isopropanol each for 5 minutes. Then, the substrate was boiled in isopropanol for 5 minutes. The substrate was taken out from isopropanol, dried by nitrogen blow, and washed with UV ozone for 20 minutes.

[4] After the washing with UV ozone, dust was removed by nitrogen blow. A 1% by mass magnesium acetate solution was spin-coated on the substrate at 1300 rpm for 60 seconds. Thereafter, the substrate was annealed on a hot plate at 150° C. for one hour.

[5] The substrate annealed was rinsed with ultrapure water and annealed on a hot plate at 150° C. for 30 minutes.

[6] A nitrogen-containing film layer 4 was formed by spin-coating a 0.1% by mass dilution of polyethyleneimine (EPOMIN®) available from Nippon Shokubai Co., Ltd. in ethanol at 2000 rpm for 30 seconds. EPOMIN used was P1000 (branch structure) having a weight average molecular weight of 70000.

[7] The thin film (substrate) obtained in step [6] was annealed on a hot plate at 150° C. for 10 minutes in air.

[8] The substrate treated in step [7] was introduced in a vacuum apparatus, and the pressure was reduced to $5 \times 10^{-5}$ Pa or lower. KHLHS-01 was deposited as an electron transport layer by 15 nm vacuum deposition and then annealed at 125° C. for 20 minutes. The substrate was again introduced in the vacuum apparatus, and the pressure was reduced to $5 \times 10^{-5}$ Pa or lower. Then, (α-NPD)/(KHLHS-04)/(KHLDR-03) as an emitting layer and α-NPD as a hole transport layer were deposited in the stated order respectively by 30 nm vacuum deposition and 24 nm vacuum deposition.

[9] A second metal oxide layer 6 was formed on an organic compound layer 5. Specifically, a molybdenum oxide film was formed by vacuum deposition, which is 10 nm vapor deposition.

[10] Finally, an anode 7 was formed on the second metal oxide layer 6. Specifically, an aluminum film was formed by 100 nm vacuum deposition.

Through steps [1] to [10], an organic electroluminescence device (1) was produced.

Figure 2:
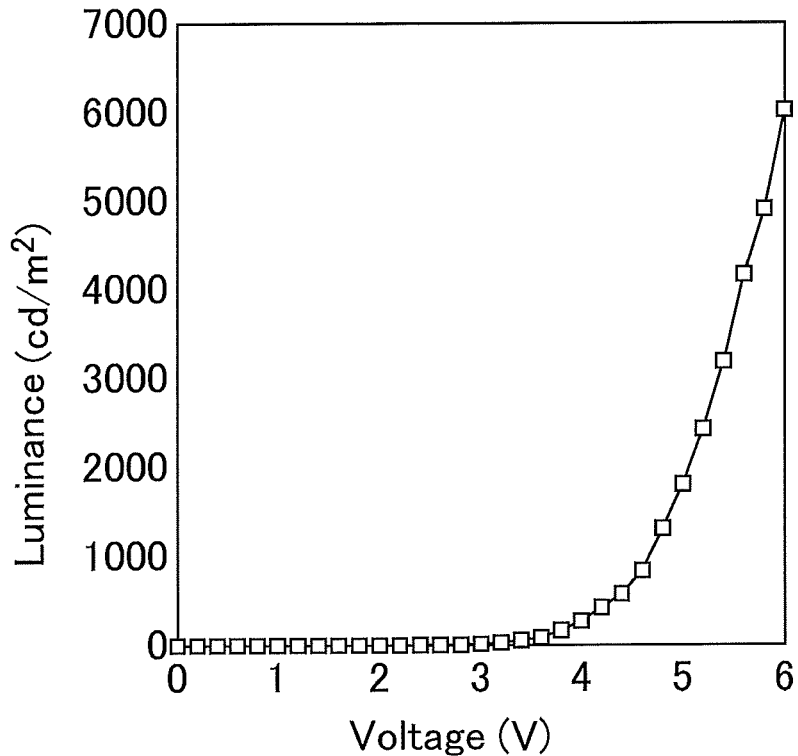
FIG. 2 includes (a) a view showing the voltage-luminance characteristics of an organic electroluminescence device (1) produced in Example 1 and (b) a view showing temporal change of the luminance and the voltage under a constant current density (corresponding to 1000 cd/m$^2$) of the organic electroluminescence device (1).
Figure 2:
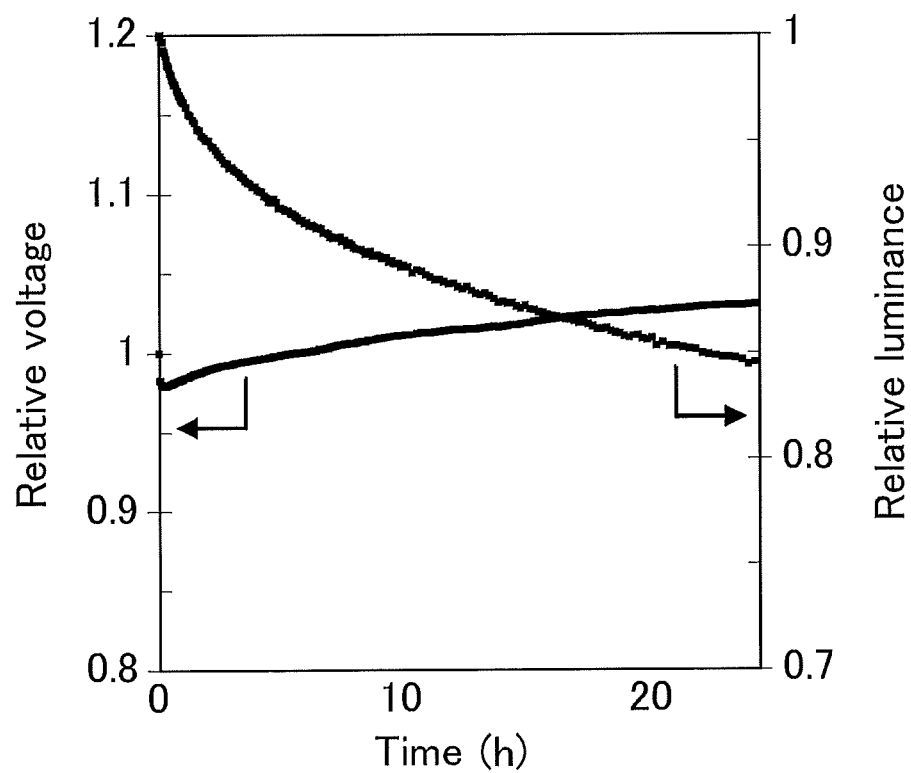

[11] The properties of the organic electroluminescence device (1) (voltage-luminance characteristics and temporal variation of luminance and voltage under a constant current density (corresponding to 1000 cd/m$^2$)) were evaluated according to <Measurement of luminescence properties of organic electroluminescence device> and <Measurement of lifetime properties of organic electroluminescence device> as follows. The results are shown in FIG. 2.

<Measurement of Luminescence Properties of Organic Electroluminescence Device>

"Series 2400 SourceMeter" available from Keithley Instruments was used to apply a voltage to the device and to measure the current. The luminance was measured with "BM-7" available from Topcon Corporation. The measurement was performed in an argon atmosphere.

<Measurement of Lifetime Properties of Organic Electroluminescence Device>

"Organic EL lifetime measuring apparatus" available from System Engineers Co., Ltd. was used to apply a voltage to the device and to measure the relative luminance. The apparatus can measure the relative luminance with a photodiode while the voltage is automatically controlled so that a constant current flows through the device. The current value was set for each device so that the luminance at the start of measurement was 1000 cd/m$^2$.

Example 2

Figure 3:
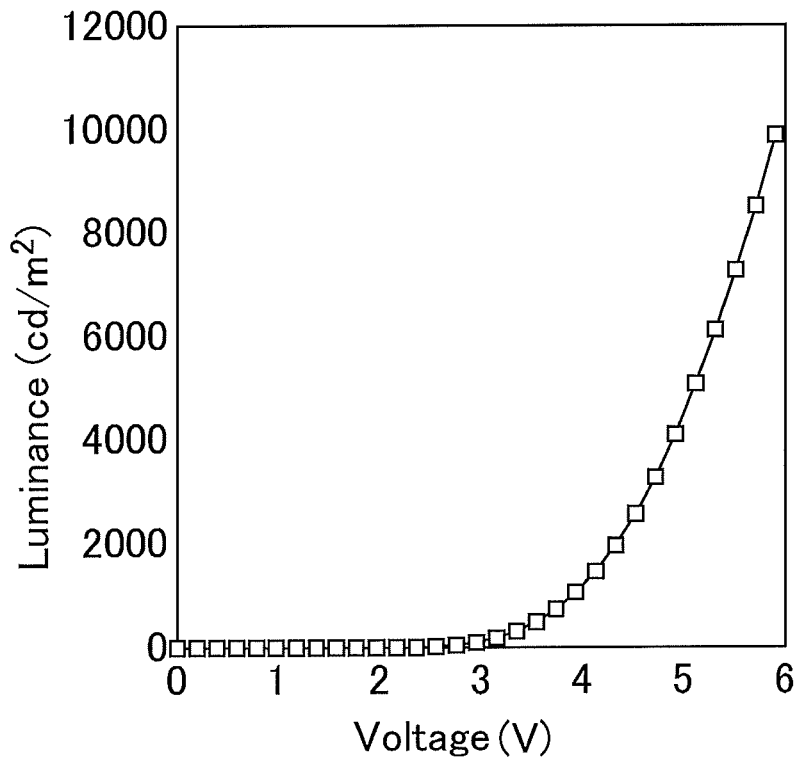
FIG. 3 includes (a) a view showing the voltage-luminance characteristics of an organic electroluminescence device (2) produced in Example 2 and (b) a view showing temporal change of the luminance and the voltage under a constant current density (corresponding to 1000 cd/m$^2$) of the organic electroluminescence device (2).
Figure 3:
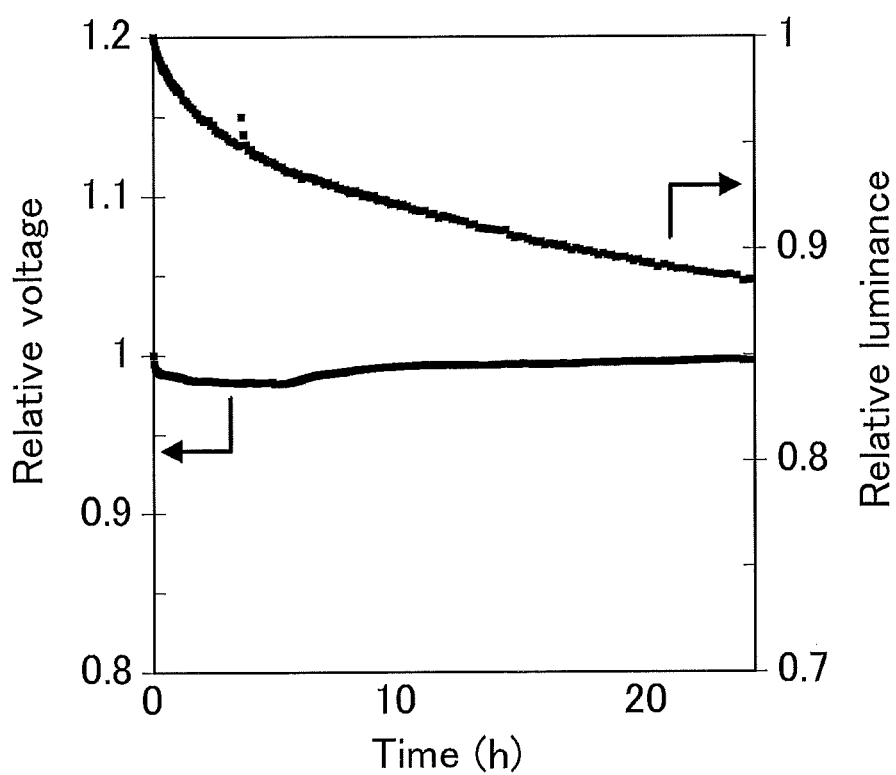

An organic electroluminescence device (2) was produced as in Example 1, except that step [7] was changed to the following step [7-2], and the properties thereof were evaluated. The results are shown in FIG. 3.

[7-2] The thin film (substrate) produced in step [6] was annealed on a hot plate at 150° C. for 10 minutes in nitrogen.

Example 3

Figure 4:
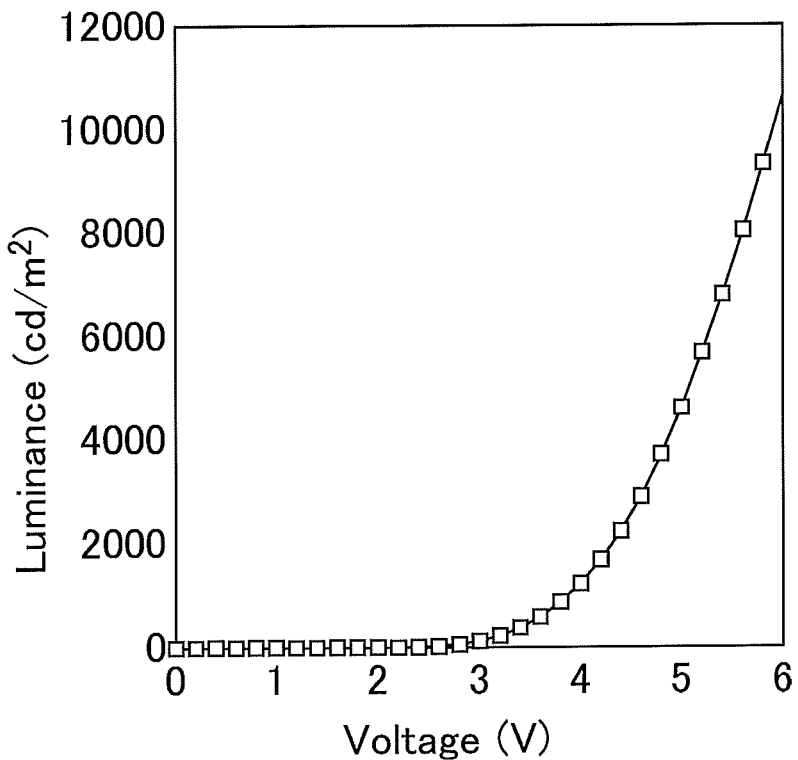
FIG. 4 includes (a) a view showing the voltage-luminance characteristics of an organic electroluminescence device (3) produced in Example 3 and (b) a view showing temporal change of the luminance and the voltage under a constant current density (corresponding to 1000 cd/m$^2$) of the organic electroluminescence device (3).
Figure 4:
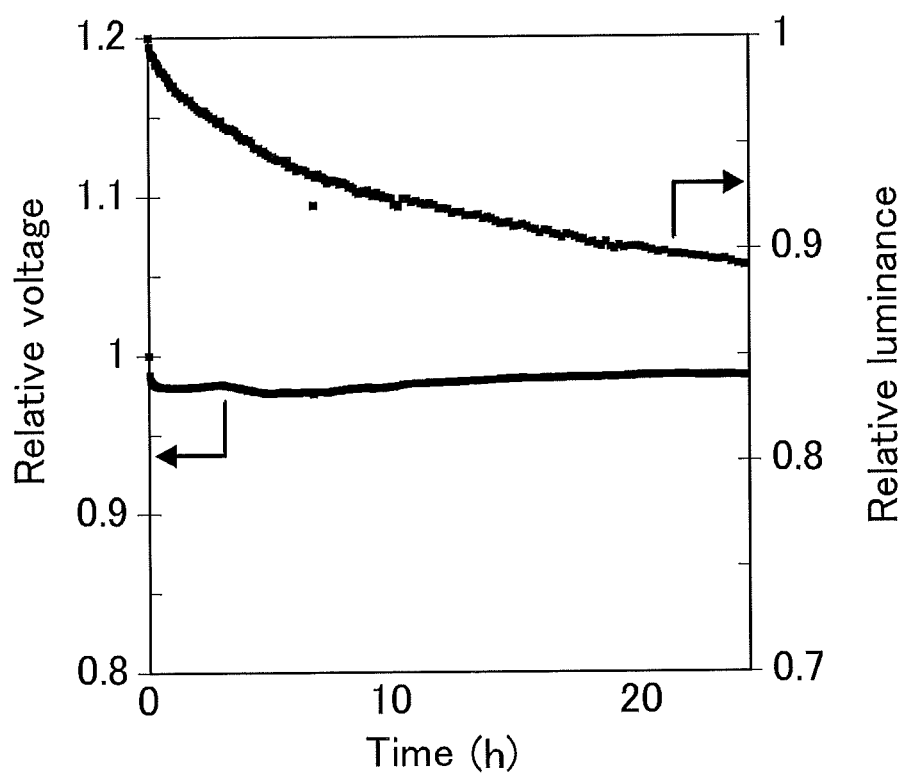

An organic electroluminescence device (3) was produced as in Example 1, except that step [7] was skipped, and the properties thereof were evaluated. The results are shown in FIG. 4.

Comparative Example 1

Figure 5:
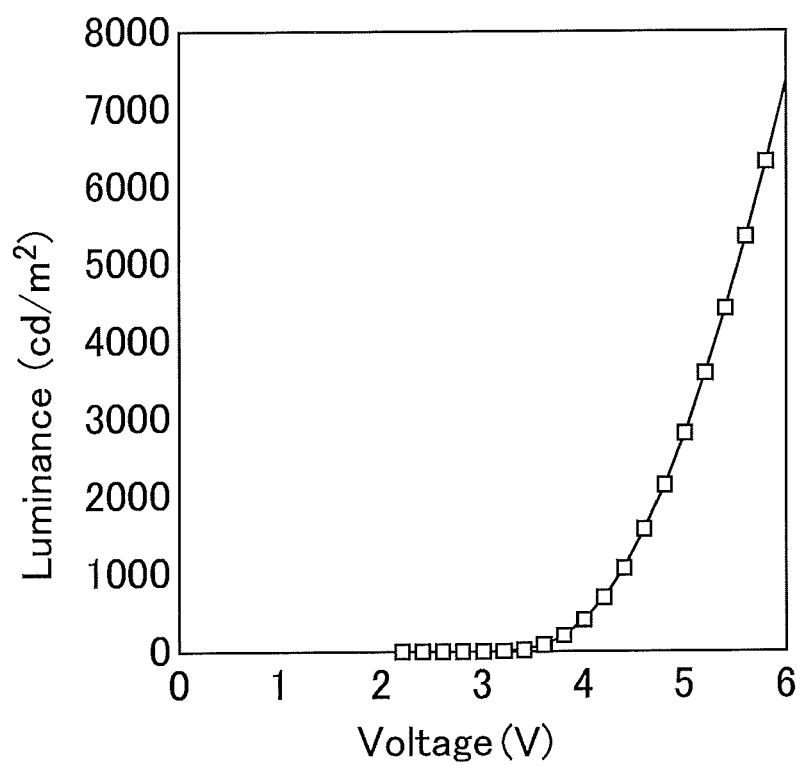
FIG. 5 is a view showing the voltage-luminance characteristics of a comparative organic electroluminescence device (1) produced in Comparative Example 1.

A comparative organic electroluminescence device (1) was produced as in Example 1, except that step [6] was changed to the following step [6-2] and step [11] was changed to the following step [11-2], and the properties thereof were evaluated. The results are shown in FIG. 5.

[6-2] A nitrogen-containing film layer 4 was formed by spin-coating a 0.4% by mass dilution of polyethyleneimine (EPOMIN®) available from Nippon Shokubai Co., Ltd. in ethanol at 2000 rpm for 30 seconds. EPOMIN used was P1000 having a molecular weight of 70000.

[11-2] The properties of the organic electroluminescence device (voltage-luminance characteristics) were measured according to the following <Measurement of Luminescence Properties of Organic Electroluminescence Device>.

<Measurement of Luminescence Properties of Organic Electroluminescence Device>

"Series 2400 SourceMeter" available from Keithley Instruments was used to apply a voltage to the device and to measure the current. The luminance was measured with "BM-7" available from Topcon Corporation. The measurement was performed in an argon atmosphere.

Example 4

Figure 6:
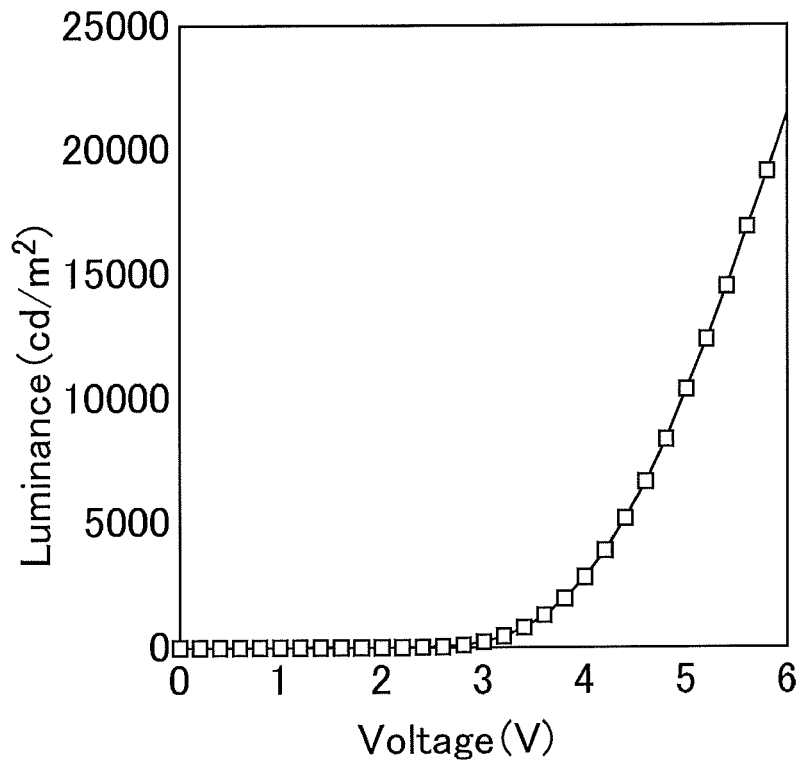
FIG. 6 includes (a) a view showing the voltage-luminance characteristics of an organic electroluminescence device (4) produced in Example 4 and (b) a view showing temporal change of the luminance and the voltage under a constant current density (corresponding to 1000 cd/m$^2$) of the organic electroluminescence device (4).
Figure 6:
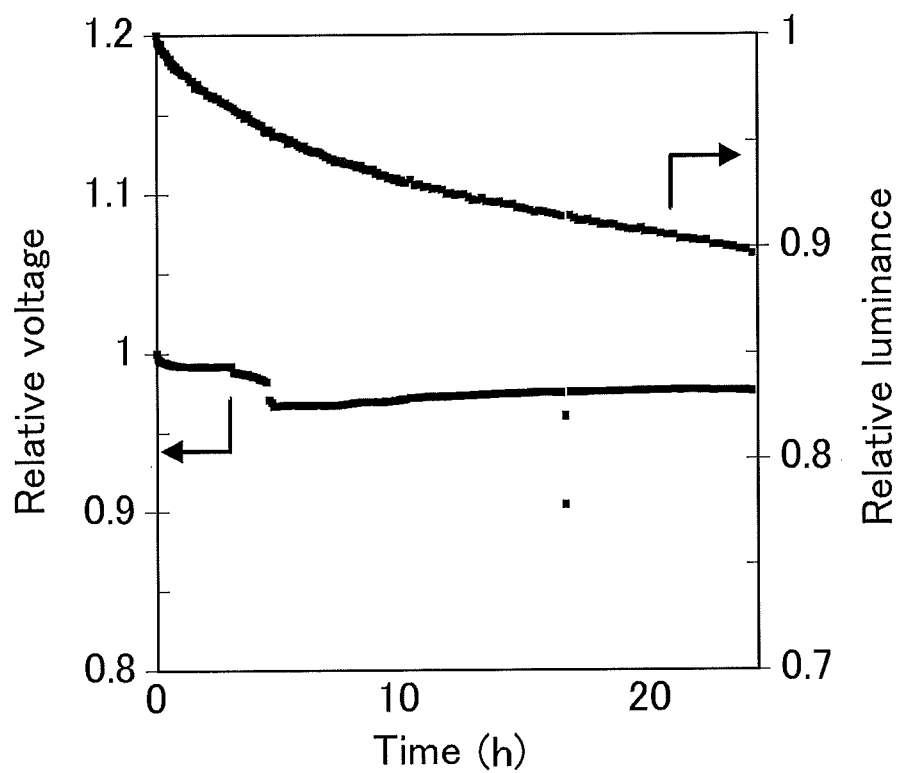

An organic electroluminescence device (4) was produced as in Example 1, except that step [6] was changed to the following step [6-3], and the properties thereof were evaluated. The results are shown in FIG. 6.

[6-3] A nitrogen-containing film layer 4 was formed by spin-coating a 0.1% by mass dilution of polyethyleneimine (EPOMIN®) available from Nippon Shokubai Co., Ltd. in ethanol at 2000 rpm for 30 seconds. EPOMIN used was P1000 having a molecular weight of 70000. After the spin coating, the substrate was rinsed with ethanol.

Example 5

Figure 7:
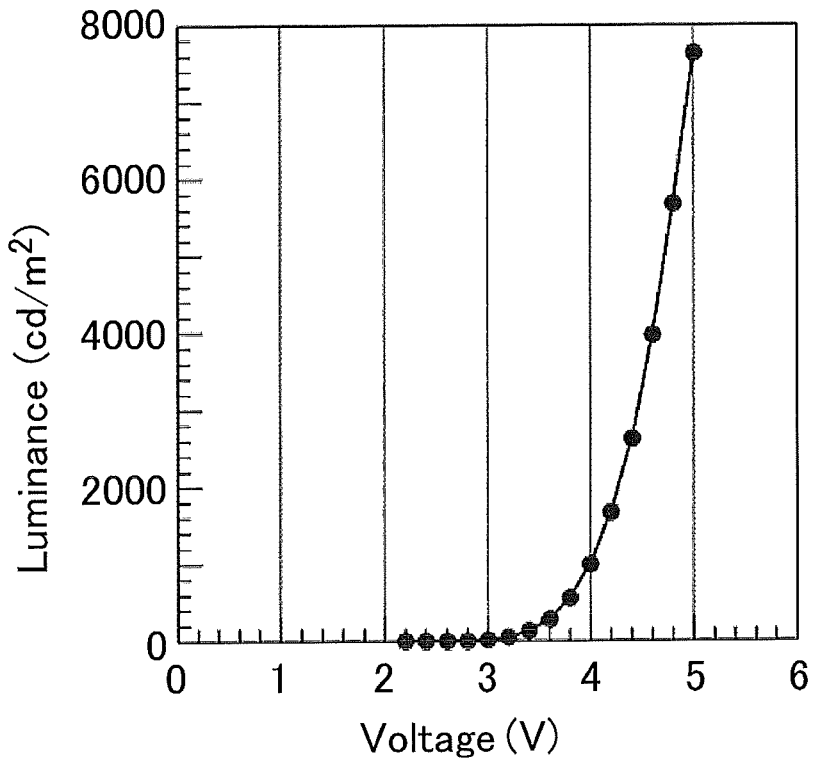
FIG. 7 includes (a) a view showing the voltage-luminance characteristics of an organic electroluminescence device (5) produced in Example 5 and (b) a view showing temporal change of the luminance under a constant current density (corresponding to 1000 cd/m$^2$) of the organic electroluminescence device (5).
Figure 7:
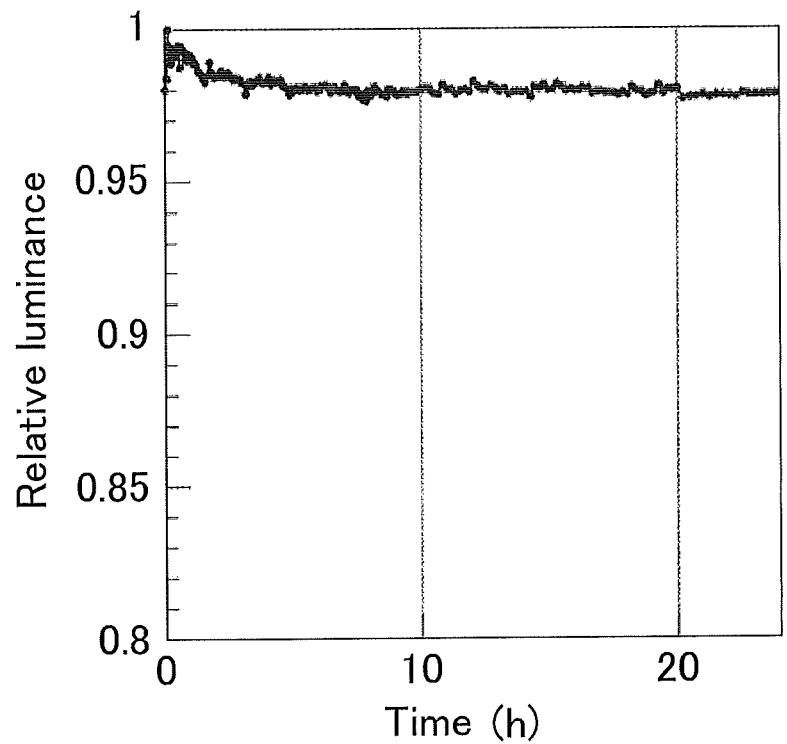

An organic electroluminescence device (5) was produced as in Example 1, except that step [6] was changed to the following step [6-4], and the properties thereof were evaluated. The results are shown in FIG. 7.

[6-4] A nitrogen-containing film layer 4 was formed by spin-coating a 0.1% by mass dilution of polyethyleneimine (EPOMIN®) available from Nippon Shokubai Co., Ltd. in ethanol at 2000 rpm for 30 seconds. EPOMIN used was SP600 (branch structure) having a weight average molecular weight of 600. After the spin coating, the substrate was rinsed with ethanol.

Example 6

Figure 8:
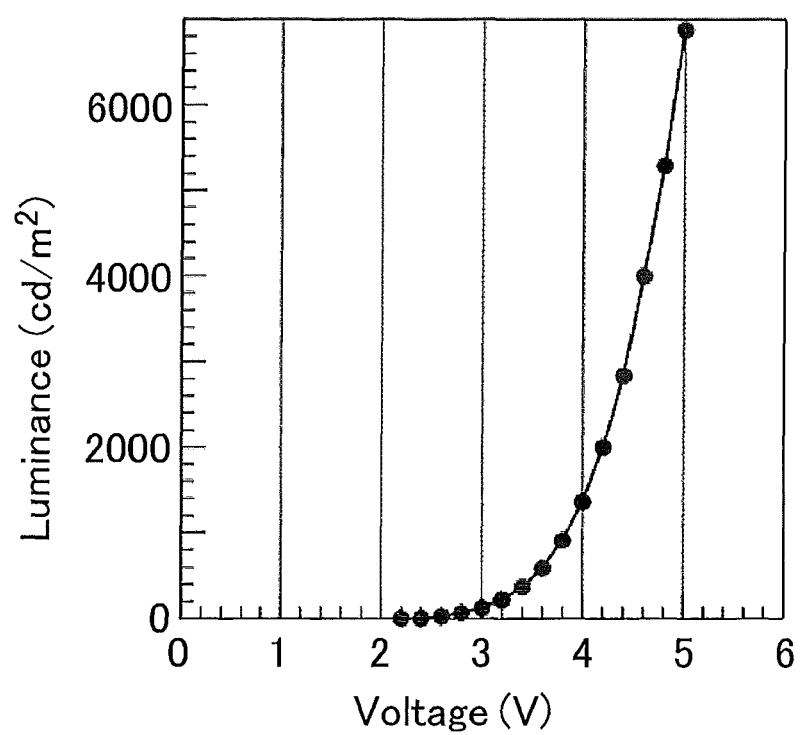
FIG. 8 is a view showing the voltage-luminance characteristics of an organic electroluminescence device (6) produced in Example 6.

An organic electroluminescence device (6) was produced as in Example 1, except that step [6] was changed to the following step [6-5], and the properties thereof were evaluated. The results are shown in FIG. 8.

[6-5] A nitrogen-containing film layer 4 was formed by spin-coating a 0.1% by mass dilution of linear polyethyleneimine having a weight average molecular weight of 11000 in ethanol at 3000 rpm for 30 seconds. After the spin coating, the substrate was rinsed with ethanol.

Example 7

Figure 9:
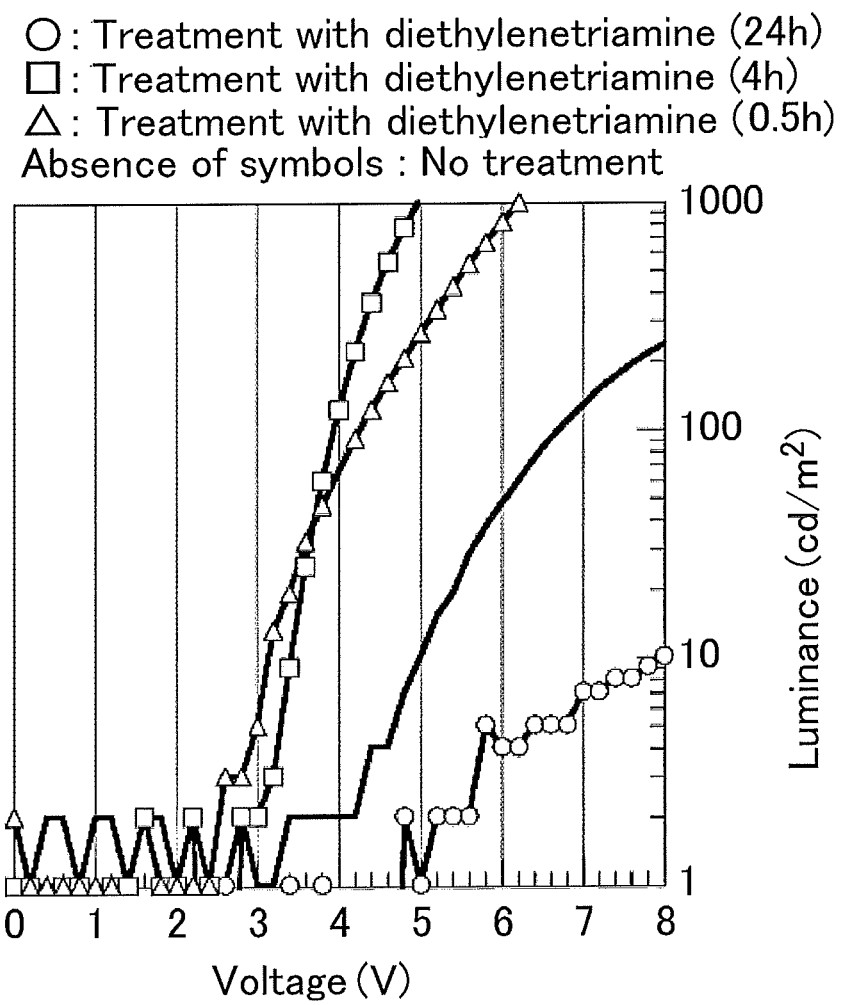
FIG. 9 is a view showing the voltage-luminance characteristics of organic electroluminescence devices (7) and (8) produced in Examples 7 and 8, respectively, and comparative organic electroluminescence devices (2) and (3) produced in Comparative Examples 2 and 3, respectively.

An organic electroluminescence device (7) was produced as in Example 1, except that step [6] was changed to the following step [6-6], step [11] was changed to the above step [11-2], and step [7] was skipped, and the properties thereof were evaluated. The results are shown in FIG. 9.

[6-6] A nitrogen-containing film layer 4 was formed by exposing the substrate to diethylenetriamine vapor for 0.5 hours.

Example 8

An organic electroluminescence device (8) was produced as in Example 1, except that step [6] was changed to the following step [6-7], step [11] was changed to the step [11-2], and step [7] was skipped, and the properties thereof were evaluated. The results are shown in FIG. 9.

[6-7] A nitrogen-containing film layer 4 was formed by exposing the substrate to diethylenetriamine vapor for 4 hours.

Comparative Example 2

A comparative organic electroluminescence device (2) was produced as in Example 1, except that steps [6] and [7] in Example 1 were skipped and step [11] was changed to the step [11-2], and the properties thereof were evaluated. The results are shown in FIG. 9.

Comparative Example 3

A comparative organic electroluminescence device (3) was produced as in Example 1, except that step [6] was changed to the following step [6-8], step [7] was skipped, and step [11] was changed to the step [11-2], and the properties thereof were evaluated. The results are shown in FIG. 9.

[6-8] A nitrogen-containing film layer 4 was formed by exposing the substrate to diethylenetriamine vapor for 24 hours.

Example 9

Figure 10:
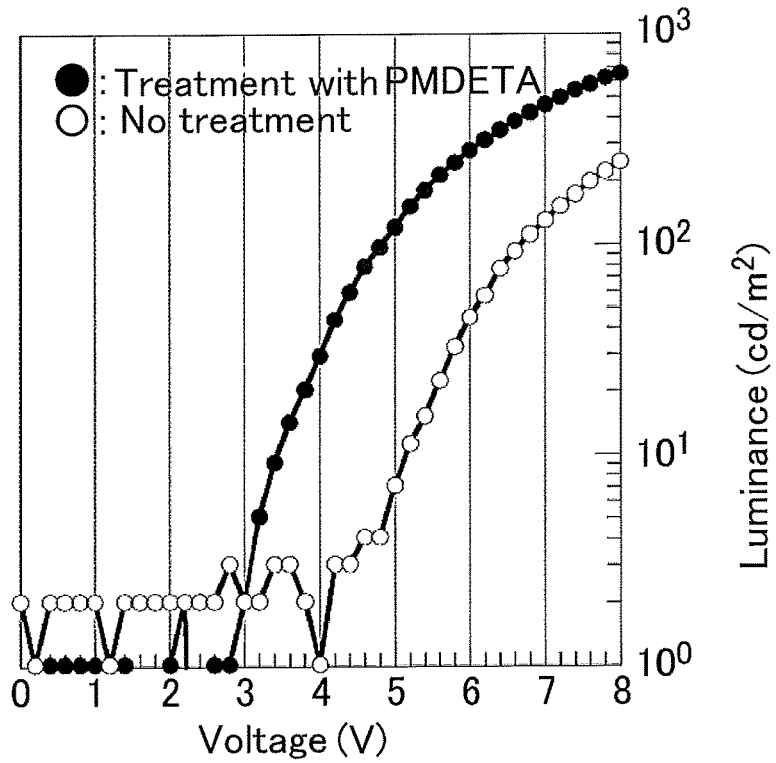
FIG. 10 is a view showing the voltage-luminance characteristics of an organic electroluminescence device (9) produced in Example 9.

An organic electroluminescence device (9) was produced as in Example 1, except that step [6] was changed to the following step [6-9], step [7] was skipped, and step [11] was changed to the step [11-2], and the properties thereof were evaluated. The results are shown in FIG. 10.

[6-9] A nitrogen-containing film layer 4 was formed by spin-coating a 0.1% by mass dilution of pentamethyldiethylenetriamine in ethanol at 2000 rpm for 30 seconds.

Example 10

Figure 12:
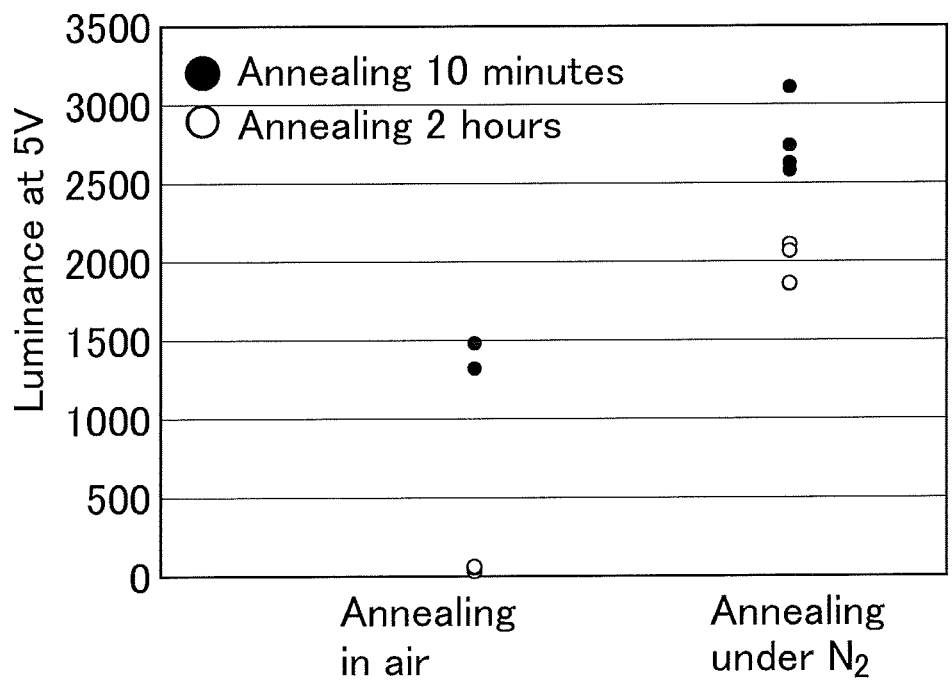
FIG. 12 is a view showing results of evaluating the variations in the device properties of the organic electroluminescence devices (1), (2), (10), and (11) produced in Examples (1), (2), (10), and (11) between annealing in air and annealing in a nitrogen atmosphere.

An organic electroluminescence device (10) was produced as in Example 1, except that step [7] was changed to the following step [7-3], and the properties thereof were evaluated. The results are shown in FIG. 12.

[7-3] The thin film (substrate) produced in step [6] was annealed on a hot plate at 150° C. for 2 hours in air.

Example 11

An organic electroluminescence device (11) was produced as in Example 1, except that step [7] was changed to the following step [7-4], and the properties thereof were evaluated. The results are shown in FIG. 12.

[7-4] The thin film (substrate) produced in step [6] was annealed on a hot plate at 150° C. for 2 hours in nitrogen.

The following describes the results shown in FIG. 2 to FIG. 4.

These figures show the results of evaluation of the properties of the devices under different annealing conditions after forming the nitrogen-containing film. FIG. 2 shows the results of the device (1) with annealing in air, FIG. 3 shows the result of the device (2) with annealing in nitrogen, and FIG. 4 shows the result of the device (3) with no annealing. These devices start to emit light at low voltage and achieve a sufficient luminance. Simultaneously, these devices achieve an reasonably long lifetime. The thicknesses of the nitrogen-containing films of these devices were 1.77, 2.13, and 2.28 nm, which are all less than 3 nm. This demonstrates that the organic electroluminescence devices including a thin nitrogen-containing film having a thickness of less than 3 nm achieve high performance.

The variation in thickness of these films is considered to occur due to a reduction in film thickness by annealing. A large reduction in film thickness in air is presumably due to the reaction with oxygen in air. A reduction in film thickness by annealing in nitrogen is presumably due to a volume reduction caused by removal of a residual solvent and rearrangement of polyethylenimine due to heating. Thus, the thickness of the nitrogen-containing film is smaller, in ascending order, from "in air" to "in nitrogen" to "no annealing". The difference between the film thickness in the case of "in air" is slightly larger than other cases. This is presumably due to occurrence of reaction.

While the devices (1) to (3) all have a certain level or higher of properties, they are different in properties. For example, the luminance under a certain voltage and the device lifetime under constant current-driving in the case of annealing "in air" are higher than those in the case of annealing "in nitrogen" and those in the case of "no annealing", and those in the case of annealing "in nitrogen" are similar to those in the case of "no annealing". But all of these three devices (1) to (3) have high properties.

The results shown in FIGS. 5 and 6 are described.

FIG. 5 shows the results of the device (comparative device (1)) including a nitrogen-containing film prepared under the same optimal conditions as in the case of the nitrogen-containing film in FIG. 3 (device (2)) except that the thickness was increased to 4.50 nm. The comparative device (1) does not correspond to the organic electroluminescence device of the present invention. The results demonstrate that the emission threshold voltage is increased by about 0.5 V, and the emission luminance at 6 V is reduced by about 3000 cd/m$^2$.

FIG. 6 shows the results of examinations of a thinner nitrogen-containing film under the optimal conditions. This thinner nitrogen-containing film has a thickness of 1.76 nm which is as small as the thickness of the nitrogen-containing film with annealing "in air", and the properties such as luminance and lifetime are higher than those in any of the cases of FIG. 2 to FIG. 5.

The results demonstrate that the organic electroluminescence devices including a nitrogen-containing film having a thickness of 3 nm or smaller have sufficiently high properties. In particular, annealing "in nitrogen" for a thinner nitrogen-containing film is suitable.

The results shown in FIGS. 7 and 8 are described.

FIGS. 7 and 8 show the results of branched polyethylenimine having a weight average molecular weight of 600 and linear polyethylenimine having a weight average molecular weight of 11000. The results both show favorable EL properties.

The results shown in FIG. 9 are described.

FIG. 9 shows the measurement results of the devices (7) and (8) and the comparative device (3) each including a film formed from diethylenetriamine that is a model substance corresponding to a partial unit cut from polyethylenimine, and the comparative device (2) including no nitrogen-containing film. The films were formed by vapor exposure, but may be formed by any method. They may be formed by a common film formation method such as spin coating that is used to prepare a film by application. In the case of vapor exposure, the film thickness can be controlled by exposure time. In the case of the device (7) in which the vapor exposure time was 0.5 hours, the thickness of the film was 1.60 nm, in the case of the device (8) in which the vapor exposure time was 4 hours, the thickness of the film was 1.82 nm, and in the case of the comparative device (3) in which the vapor exposure time was 24 hours, the thickness of the film was 7.17 nm. In the case of the comparative device (2) in which no treatment for forming nitrogen-containing film was performed, the thickness of the film was 0.04 nm, which demonstrates that the measurement is highly precise. Just as the polyethylenimine film having a thickness in the 1-nm range formed by spin coating has good properties, the films having a thickness in the 1-nm range formed from the aforementioned material have good properties as well. The emission threshold voltage was better in the case of the vapor exposure for 0.5 hours, but the luminance at 6 V was better in the case of the vapor exposure for 4 hours. This difference is presumably due to the difference in film structure. The device with the vapor exposure for 24 hours is inferior to the device even with no treatment for forming nitrogen-containing film in both the emission threshold voltage and the luminance at 6 V. These results also show that the film having a thickness of 3 nm or less is preferable.

The results shown in FIG. 10 are described.

FIG. 10 shows the results of evaluation of the properties of the device (9) including a nitrogen-containing film formed from pentamethyldiethylenetriamine, as a model substance, which consists of only a tertiary amine by spin coating. While the nitrogen-containing film is an extremely thin film having a thickness of 0.16 nm, the properties of the device (9) are more enhanced than those of the comparative device (2) with no treatment for forming nitrogen-containing film. This demonstrates that even an extremely thin film having a thickness of less than 1 nm can be expected to have enhanced properties.

Figure 11:
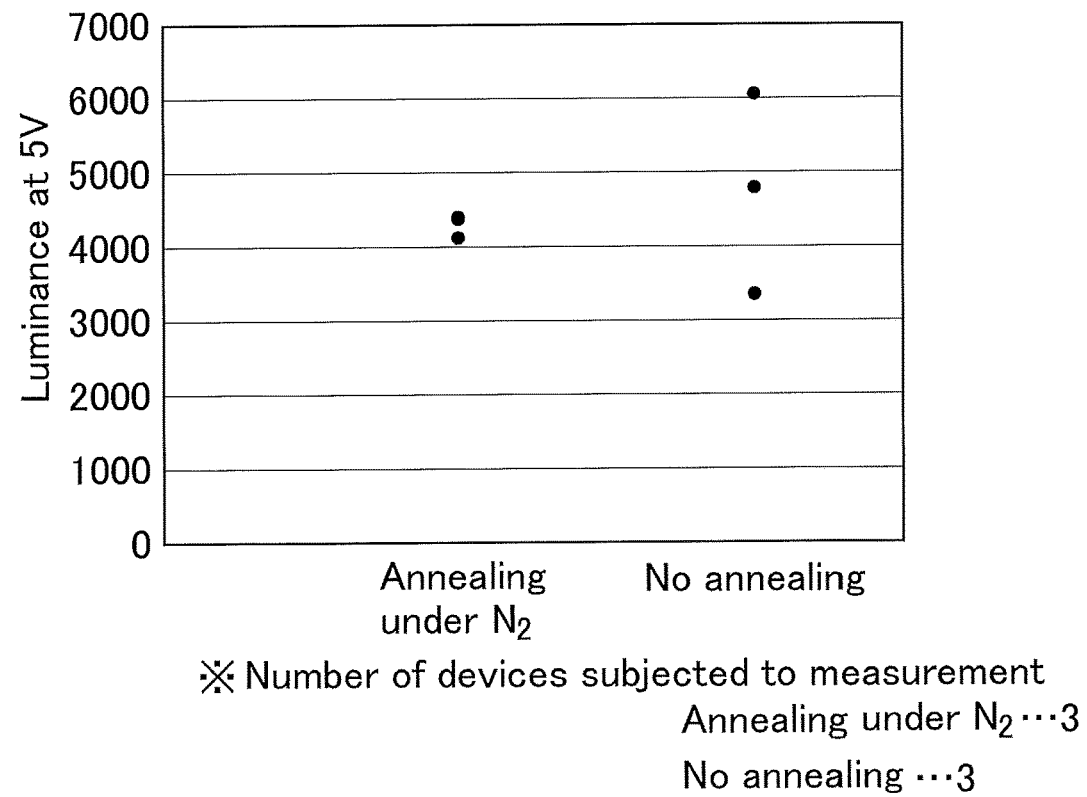
FIG. 11 is a view showing results of evaluating the variations in the device properties of the organic electroluminescence devices (2) and (3) produced in Examples 2 and 3 between the presence and absence of annealing.

Finally, the results shown in FIGS. 11 and 12 are described.

FIG. 11 shows the measurement values of the luminance at 5 V of three devices (2) according to Example 2 and three devices (3) according to Example 3, and comparison of the variations in the properties of the devices. The results of the case of annealing in nitrogen are more similar to each other than the results of the case of no annealing. This suggests that annealing reduces the variations of the properties. This means that annealing enhances the process stability, which is presumably due to the effect of rearrangement caused by annealing.

FIG. 12 shows the results of the examinations of environmental dependence of annealing with high process stability. The device (1) with annealing "in air" for 10 minutes, the device (2) with annealing "in nitrogen" for 10 minutes, the device (10) with annealing "in air" for two hours, and the device (11) with annealing "in nitrogen" for two hours are each produced as many as the numbers described on the margin of FIG. 12. The luminance values at 5 V of the devices are compared. This demonstrates that long-time annealing is unfavorable in both of the environments. Further, the devices with annealing "in air" are more greatly deteriorated to the extent that they can hardly emit light. In contrast, the devices with annealing "in nitrogen" have reduced luminance, but still have enough luminance. FIG. 11 and FIG. 12 demonstrate that the devices with annealing "in nitrogen" have excellent process stability.

These demonstrated that the devices including a thin film having a thickness of not less than 0.1 nm to less than 3 nm formed from any of a low-molecular material and a high-molecular material each having a polyethylenimine main chain have good properties.

In particular, a thinner film is more favorable, and a film having good properties can be produced not only by a common application process, but also by other methods such as vapor deposition by vapor exposure. The subsequent process is favorably annealing in nitrogen also in terms of process stability.

REFERENCE SIGNS LIST

1: substrate
2: cathode
3: first metal oxide layer

4: nitrogen-containing film layer
5: organic compound layer
6: second metal oxide layer
7: anode

The invention claimed is:

1. An organic electroluminescence device comprising a structure in which a plurality of layers is laminated between an anode and a cathode formed on a substrate;
   wherein the plurality of layers comprise:
      a metal oxide layer between the anode and the cathode;
      a nitrogen-containing film layer having an average thickness of not less than 0.1 nm but less than 3 nm adjacent to the metal oxide layer and disposed on an anode side; and
      an organic compound layer consisting of a single layer or multiple layers,
      wherein the metal oxide layer is disposed between the cathode and the organic compound layer, and
      the nitrogen-containing film layer is disposed between the metal oxide layer and the organic compound layer.

2. The organic electroluminescence device according to claim 1,
   wherein the nitrogen-containing film is a film derived from a nitrogen-containing compound having a primary amine structure.

3. The organic electroluminescence device according to claim 2,
   wherein the nitrogen-containing compound is polyethylenimine or diethylenetriamine.

4. The organic electroluminescence device according to claim 2,
   wherein the nitrogen-containing compound is branched polyethylenimine having a weight average molecular weight of 100 to 1000.

5. The organic electroluminescence device according to claim 1,
   wherein the nitrogen-containing film is formed by decomposition of a nitrogen-containing compound by heating.

* * * * *